(12) United States Patent
Lim et al.

(10) Patent No.: US 10,128,255 B2
(45) Date of Patent: Nov. 13, 2018

(54) SEMICONDUCTOR DEVICE

(71) Applicant: Samsung Electronics Co., Ltd., Suwon-si, Gyeonggi-do (KR)

(72) Inventors: Sun-Me Lim, Yongin-si (KR); Kyung-Woo Kim, Seoul (KR); Myung-Soo Seo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/075,715

(22) Filed: Mar. 21, 2016

(65) Prior Publication Data

US 2016/0204114 A1  Jul. 14, 2016

Related U.S. Application Data

(62) Division of application No. 13/940,384, filed on Jul. 12, 2013, now Pat. No. 9,312,261.

(30) Foreign Application Priority Data

Oct. 17, 2012  (KR) ........................ 10-2012-0115510

(51) Int. Cl.
*H01L 27/11* (2006.01)
*H01L 27/092* (2006.01)
(Continued)

(52) U.S. Cl.
CPC .. *H01L 27/1116* (2013.01); *H01L 21/823892* (2013.01); *H01L 27/0207* (2013.01);
(Continued)

(58) Field of Classification Search
CPC ............................ H01L 27/11; H01L 27/1104
See application file for complete search history.

(56) References Cited

U.S. PATENT DOCUMENTS

| 5,486,717 A | 1/1996 | Kokubo et al. |
| 5,578,873 A * | 11/1996 | Manning ................. H01L 27/11 |
| | | 257/382 |

(Continued)

FOREIGN PATENT DOCUMENTS

| JP | 4078510 B2 | 4/2008 |
| JP | 2008-130903 A | 6/2008 |

(Continued)

OTHER PUBLICATIONS

Verma, N. et al. "A 256 kb 65 nm 8T Subthreshold SRAM Employing Sense-Amplifier Redundancy"; IEEE Journal of Solid-State Circuits, vol. 43, No. 1; Jan. 2008.

(Continued)

*Primary Examiner* — Michele Fan
(74) *Attorney, Agent, or Firm* — Harness, Dickey & Pierce, P.L.C.

(57) ABSTRACT

A semiconductor device includes first and second well regions having a first conductivity type, and a third well region between the first and second well regions having a second conductivity type different from the first conductivity type. A first active region is in the first well region. A second active region is in the second well region. A third active region is in the third well region. The third active region is closer to the second active region than to the first active region. A fourth active region is in the third well region. The fourth active region is closer to the first active region than to the second active region. A first conductive pattern is across the first and third active regions. A second conductive pattern is across the second and fourth active regions and parallel to the first conductive pattern.

17 Claims, 16 Drawing Sheets

(51) Int. Cl.
  *H01L 27/088* (2006.01)
  *H01L 21/8238* (2006.01)
  *H01L 27/02* (2006.01)

(52) U.S. Cl.
  CPC .......... *H01L 27/088* (2013.01); *H01L 27/092* (2013.01); *H01L 27/1104* (2013.01)

(56) References Cited

U.S. PATENT DOCUMENTS

| | | | |
|---|---|---|---|
| 6,399,445 | B1 | 6/2002 | Hattangady et al. |
| 6,534,805 | B1 | 3/2003 | Jin |
| 7,120,080 | B2 | 10/2006 | Lee et al. |
| 7,439,153 | B2 | 10/2008 | Tsuboi et al. |
| 7,486,543 | B2 | 2/2009 | Kang et al. |
| 7,605,447 | B2 | 10/2009 | Doris et al. |
| 8,035,169 | B2 | 10/2011 | Ishida et al. |
| 2002/0186581 | A1* | 12/2002 | Yamaoka ............... G11C 11/412 365/154 |
| 2004/0036088 | A1 | 2/2004 | Tsukamoto et al. |
| 2004/0151041 | A1 | 8/2004 | Lee et al. |
| 2005/0078546 | A1 | 4/2005 | Hirano et al. |
| 2005/0230740 | A1 | 10/2005 | Lee |
| 2005/0276094 | A1* | 12/2005 | Yamaoka ............... G11C 11/412 365/154 |
| 2006/0214212 | A1 | 9/2006 | Horita et al. |
| 2007/0096184 | A1 | 5/2007 | Akamatsu |
| 2007/0241411 | A1 | 10/2007 | Yang et al. |
| 2007/0272985 | A1 | 11/2007 | Hsieh et al. |
| 2008/0042218 | A1 | 2/2008 | Igarashi et al. |
| 2008/0083991 | A1 | 4/2008 | Yang et al. |
| 2008/0121942 | A1 | 5/2008 | Liaw |
| 2008/0203493 | A1 | 8/2008 | Yasuda |
| 2008/0273382 | A1 | 11/2008 | Wang |
| 2008/0303105 | A1 | 12/2008 | Chang et al. |
| 2009/0080236 | A1 | 3/2009 | Nakamura |
| 2009/0096031 | A1* | 4/2009 | Ekbote ................. G11C 11/412 257/369 |
| 2009/0108356 | A1 | 4/2009 | Cheng et al. |
| 2009/0218631 | A1 | 9/2009 | Zhu et al. |
| 2009/0278204 | A1 | 11/2009 | Morino et al. |
| 2011/0073958 | A1 | 3/2011 | Chang et al. |
| 2011/0233629 | A1 | 9/2011 | Han |
| 2011/0235407 | A1 | 9/2011 | Lim et al. |
| 2011/0242882 | A1* | 10/2011 | Asayama ............... G11C 11/412 365/154 |
| 2011/0278677 | A1 | 11/2011 | Otsuki et al. |
| 2011/0317477 | A1 | 12/2011 | Liaw |
| 2011/0317485 | A1 | 12/2011 | Liaw |
| 2012/0037971 | A1 | 2/2012 | Kwon et al. |
| 2012/0230120 | A1 | 9/2012 | Torii |
| 2013/0056832 | A1 | 3/2013 | Sato et al. |
| 2013/0121087 | A1 | 5/2013 | Liaw |
| 2013/0235652 | A1 | 9/2013 | Liaw |
| 2013/0242448 | A1 | 9/2013 | Salcedo et al. |
| 2013/0272056 | A1 | 10/2013 | Liaw |
| 2013/0292777 | A1 | 11/2013 | Liaw |
| 2015/0009750 | A1 | 1/2015 | Schaefer et al. |

FOREIGN PATENT DOCUMENTS

| | | |
|---|---|---|
| JP | 2008-282843 A | 11/2008 |
| KR | 2003-0034469 A | 5/2003 |
| KR | 2007-0023458 A | 2/2007 |

OTHER PUBLICATIONS

Verkila, S. et al. "A 100MHz to 1GHz, 0.35V to 1.5V Supply 256 x 64 SRAM Block using Symmetrized 9T SRAM Cell with Controlled Read"; 21st International Conference on VLSI Design; 2008.
Kim, t. et al. "A High-Density Subthreshold SRAM with Data-Independent Bitline Leakage and Virtual Ground Replica Scheme"; IEEE International Solid-State Circuits Conference; 2007.

* cited by examiner

SEMICONDUCTOR DEVICE

CROSS-REFERENCE TO RELATED APPLICATION

This application is a divisional application of U.S. application Ser. No. 13/940,384, filed on Jul. 12, 2013, which claims priority under 35 U.S.C. § 119 to Korean Patent Application No. 10-2012-0115510 filed on Oct. 17, 2012, the entire contents of each of which are incorporated herein by reference.

BACKGROUND

1. Field

Some example embodiments relate to a semiconductor device and an electronic system.

2. Description of Related Art

A static random access memory (SRAM) device, which is used as a cache memory of a portable electronic product or a computer, exhibits relatively low power consumption and operates at a relatively high speed. SRAM devices may include a high-load resistor SRAM device using a high-load resistor, and a complementary metal-oxide-semiconductor (CMOS) device using a CMOS. In general, the CMOS SRAM device exhibits desirable low-voltage characteristics and requires a relatively low stand-by current.

SUMMARY

Some example embodiments provide a semiconductor device capable of improving dispersion characteristics. Other example embodiments provide a semiconductor device including a pair of inverters formed of a complementary metal oxide semiconductor (CMOS) with improved stability.

Other example embodiments provide a semiconductor device capable of preventing or reducing interference between adjacent elements. Other example embodiments provide a semiconductor device including a pair of inverters cross-coupled to each other to form a storage element. Other example embodiments provide an electronic system including the semiconductor devices.

The disclosure is not limited to the above example embodiments, and other example embodiments may become apparent to those of ordinary skill in the art based on the following descriptions.

In accordance with an example embodiment, a semiconductor device includes first and second well regions, and a third well region between the first and second well regions. The first and second well regions have a first conductivity type, and the third well region has a second conductivity type different from the first conductivity type. A first active region is in the first well region. A second active region is in the second well region. A third active region is in the third well region and closer to the second active region than to the first active region. A fourth active region in the third well region and closer to the first active region than to the second active region. A first conductive pattern is across the first and third active regions. A second conductive pattern is across the second and fourth active regions and parallel to the first conductive pattern.

One end portion of the third active region may be between the second and fourth active regions, and one end portion of the fourth active region may be between the first and third active regions.

Each of the first and second active regions may include a first portion having a first width, and a second portion having a second width smaller than the first width. The first portion of the first active region may face the second portion of the second active region, and the second portion of the first active region may face the first portion of the second active region.

A portion of the third active region facing the second portion of the second active region may be larger than a portion of the third active region facing the first portion of the second active region. A portion of the fourth active region facing the second portion of the first active region may be larger than a portion of the fourth active region facing the first portion of the first active region.

The first conductive pattern may have a bar shape across the first portion of the first active region and the third active region. The second conductive pattern may have a bar shape across the first portion of the second active region and the third active region.

The semiconductor device may further include a third conductive pattern across the first active region, and a fourth conductive pattern across the second active region.

The second and third conductive patterns may have end portions facing each other. The facing end portions of the second and third conductive patterns may be between the first and third active regions. Also, the first and fourth conductive patterns may have end portions facing each other. The facing end portions of the first and fourth conductive patterns may be between the second and fourth active regions.

The semiconductor device may further include a lower gate dielectric material, a middle gate dielectric material, and an upper gate dielectric material sequentially stacked on the semiconductor substrate, and between the first conductive pattern and the third active region. The upper gate dielectric material may overlap both the third active region and the first active region, and any one end portion of the middle gate dielectric material may be between the first and third active regions.

In accordance with another example embodiment, a semiconductor device includes a first access element, a second pull-up element, and a second pull-down element on a semiconductor substrate and sequentially arranged along a first direction. A first pull-down element, a first pull-up element, and a second access element are on the semiconductor substrate and sequentially arranged along the first direction. The first pull-down element and the first access element are sequentially arranged along a second direction intersecting the first direction. The second access element and the second pull-down element are sequentially arranged along the second direction. The first pull-up element is closer to the second access element than the first pull-down element, and the second pull-up element is closer to the first access element than the second pull-down element.

The first pull-down element and the first access element may be in a first active region of the semiconductor substrate. The second pull-down element and the second access element may be in a second active region of the semiconductor substrate. The first pull-up element may be in a third active region of the semiconductor substrate. The second pull-up element may be in a fourth active region of the semiconductor substrate. The third and fourth active regions may be between the first and second active regions. The third active region may be closer to the second active region than the first active region. The fourth active region may be closer to the first active region than the second active region.

The first pull-down element may be a first NMOS transistor including a first NMOS gate electrode, a first NMOS source region, and a first NMOS drain region. The first pull-up element may be a first PMOS transistor including a first PMOS gate electrode, a first PMOS source region, and a first PMOS drain region. The second pull-down element may be a second NMOS transistor including a second NMOS gate electrode, a second NMOS source region, and a second NMOS drain region. The second pull-up element may be a second PMOS transistor including a second PMOS gate electrode, a second PMOS source region, and a second PMOS drain region. The first access element may be a third NMOS transistor including a third NMOS gate electrode, a third NMOS source region, and a third NMOS drain region. The second access element may be a fourth NMOS transistor including a fourth NMOS gate electrode, a fourth NMOS source region, and a fourth NMOS drain region.

The first pull-down element and the first pull-up element may form a first inverter, and the second pull-down element and the second pull-up element may form a second inverter. The first inverter may include the first NMOS gate electrode and the first PMOS gate electrode in a bar-shape. The second inverter may include the second NMOS gate electrode and the second PMOS gate electrode in a bar-shape.

The semiconductor device may further include a first bit line electrically connected to the third NMOS drain region, a second bit line electrically connected to the fourth NMOS drain region, and a power line between the first and second bit lines and electrically connected to the first and second PMOS source regions.

The semiconductor device may further include a first ground line electrically connected to the first NMOS source region, a second ground line electrically connected to the second NMOS source region, and a word line between the first and second ground lines and electrically connected to the third and fourth NMOS gate electrodes.

The semiconductor device may further include a first shared contact pattern between the first pull-down element and the first pull-up element, and overlapping the second PMOS drain region, the first NMOS gate electrode and the first PMOS gate electrode, and a second shared contact pattern between the second pull-down element and the second pull-up element, and overlapping the first PMOS drain region, the second NMOS gate electrode and the second PMOS gate electrode.

In accordance with yet another example embodiment, a semiconductor device includes a first pull-down element and a first pull-up element sequentially arranged along a first direction on a semiconductor substrate, and a second pull-up element and a second pull-down element sequentially arranged parallel to the first pull-down element and the first pull-up element along the first direction on the semiconductor substrate, the first pull-up element between the second pull-up element and the second pull-down element, and the second pull-up element between the first pull-down element and the first pull-up element in a second direction perpendicular to the first direction.

The first pull-down element may be in a first active region disposed in a first well region of the semiconductor substrate, the first well region having a first conductivity type, the second pull-down element may be in a second active region disposed in a second well region of the semiconductor substrate, the second well region having the first conductivity type, the first pull-up element may be in a third active region disposed in a third well region of the semiconductor substrate, the third well region having a second conductivity type, the second pull-up element may be in a fourth active region disposed in the third well region of the semiconductor substrate, the third and fourth active regions may be between the first and second active regions, the third active region may be closer to the second active region than to the first active region, and the fourth active region may be closer to the first active region than to the second active region.

The first pull-down element may be a first NMOS transistor including a first NMOS gate electrode, a first NMOS source region, and a first NMOS drain region, the first pull-up element may be a first PMOS transistor including a first PMOS gate electrode, a first PMOS source region, and a first PMOS drain region, the second pull-down element may be a second NMOS transistor including a second NMOS gate electrode, a second NMOS source region, and a second NMOS drain region, and the second pull-up element may be a second PMOS transistor including a second PMOS gate electrode, a second PMOS source region, and a second PMOS drain region.

The first pull-down element and the first pull-up element may form a first inverter, the second pull-down element and the second pull-up element may form a second inverter, the first inverter may include the first NMOS gate electrode and the first PMOS gate electrode in a bar-shape, and the second inverter may include the second NMOS gate electrode and the second PMOS gate electrode in a bar-shape.

The device may further include a first shared contact pattern between the first pull-down element and the first pull-up element and overlapping the second PMOS drain region, the first NMOS gate electrode and the first PMOS gate electrode, and a second shared contact pattern between the second pull-down element and the second pull-up element and overlapping the first PMOS drain region, the second NMOS gate electrode and the second PMOS gate electrode.

Specific particulars of other example embodiments are included in detailed descriptions and drawings.

BRIEF DESCRIPTION OF THE DRAWINGS

The foregoing and other features and advantages of the inventive concepts will be apparent from the more particular description of example embodiments, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 3A through 8A are plan views of an example of a semiconductor device according to an example embodiment;

DETAILED DESCRIPTION OF THE EMBODIMENTS

Figure 1A:
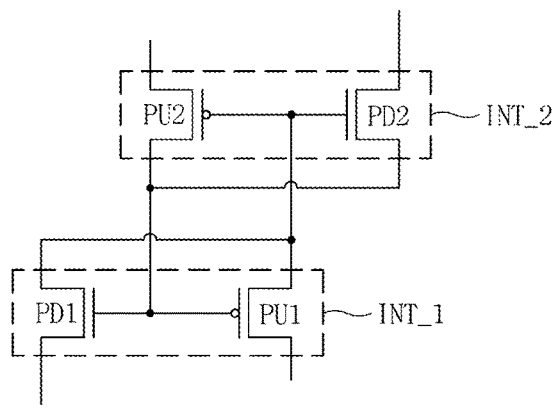
FIG. 1A is a circuit diagram of a semiconductor device according to an example embodiment.

The inventive concepts will now be described more fully hereinafter with reference to the accompanying drawings, in which example embodiments are shown. This inventive concepts may, however, be embodied in different forms and should not be construed as limited to the embodiments set forth herein. Rather, these embodiments are provided so that this disclosure is thorough and complete and fully conveys the scope of the inventive concepts to one skilled in the art. In the drawings, the sizes and relative sizes of layers and regions may be exaggerated for clarity. Like reference numerals refer to like elements throughout.

Example embodiments are described herein with reference to cross-section and plan illustrations that are schematic illustrations of idealized example embodiments of the inventive concepts. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concepts. In the drawings, the thicknesses of layers and regions may be exaggerated for clarity. It will also be understood that when a layer is referred to as being "on" another layer or substrate, it can be directly on the other layer or substrate or intervening layers may also be present. Like numbers refer to like elements throughout.

Spatially relative terms, such as "top end", "bottom end", "top surface", "bottom surface", "upper", "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of lower and upper. The device may be otherwise oriented (rotated 90 degrees or at other orientations) and the spatially relative descriptors used herein interpreted accordingly.

It will be understood that, although the terms "upper", "middle", "lower", etc. may be used herein to describe relative positions of elements, such elements should not be construed as limited by these terms. For example, an upper element could be termed a first element, a middle element could be termed a second element, and a lower element could be termed a third element, without departing from the scope of the inventive concepts.

It will be understood that, although the terms first, second, A, B, etc. may be used herein in reference to elements of the inventive concepts, such elements should not be construed as limited by these terms. For example, a first element could be termed a second element, and a second element could be termed a first element, without departing from the scope of the inventive concepts.

The terminology used herein to describe example embodiments is not intended to limit the scope of the inventive concepts.

The articles "a," "an," and "the" are singular in that they have a single referent, however the use of the singular form in the present document should not preclude the presence of more than one referent. In other words, elements of the inventive concepts referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this inventive concepts belong. It will be further understood that terms in common usage should also be interpreted as is customary in the relevant art and not in an idealized or overly formal sense unless expressly so defined herein.

Figure 1B:
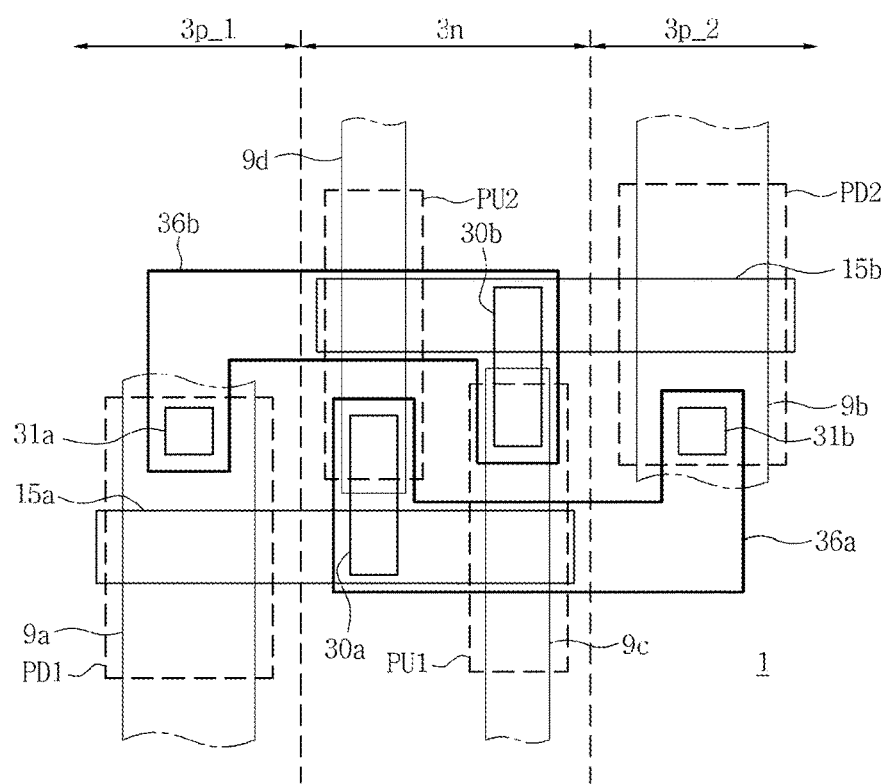
FIG. 1B is a plan view of a semiconductor device according to an example embodiment.

FIG. 1A is a circuit diagram of a semiconductor device according to an example embodiment, and FIG. 1B is a plan view of a semiconductor device according to an example embodiment. FIG. 1B is a plan view corresponding to the circuit diagram of FIG. 1A.

Referring to FIGS. 1A and 1B, a semiconductor substrate 1 including a first well region $3p\_1$, a second well region $3p\_2$, and a third well region $3n$ interposed between the first and second well regions $3p\_1$ and $3p\_2$ may be provided. The first and second well regions $3p\_1$ and $3p\_2$ may have a first conductivity type, and the third well region $3n$ may have a second conductivity type different from the first conductivity type. For example, the first and second well regions $3p\_1$ and $3p\_2$ may be p-wells of a p conductivity type, and the third well region $3n$ may be an n-well of an n conductivity type.

A first active region $9a$ may be disposed in the first well region $3p\_1$ of the semiconductor substrate 1. A second active region $9b$ may be disposed in the second well region $3p\_2$ of the semiconductor substrate 1. Third and fourth active regions $9c$ and $9d$ may be disposed in the third well region $3n$ of the semiconductor substrate 1. The third active region $9c$ may be closer to the second active region $9b$ than to the first active region $9a$. The fourth active region $9d$ may be closer to the first active region $9a$ than to the second active region $9b$. The third and fourth active regions $9c$ and $9d$ may have a smaller width than the first and second active regions $9a$ and $9b$. The first, second, third, and fourth active regions $9a$, $9b$, $9c$, and $9d$ may have portions parallel to one another.

First and second inverters INT_1 and INT_2 may be disposed on the semiconductor substrate 1. The first inverter INT_1 may include a first pull-down element PD1 and a first pull-up element PU1. The first pull-down element PD1 may be disposed on the first well region $3p\_1$ of the semiconductor substrate 1, while the first pull-up element PU1 may be disposed on the third well region $3n$. The first pull-down element PD1 may be a first NMOS transistor including a first NMOS gate electrode, a first NMOS drain region, and a first NMOS source region, while the first pull-up element PU1 may be a first PMOS transistor including a first PMOS gate electrode, a first PMOS drain region, and a first PMOS source region.

The second inverter INT_2 may include a second pull-down element PD2 and a second pull-up element PU2. The second pull-down element PD2 may be disposed on the second well region 3p_2 of the semiconductor substrate 1, while the second pull-up element PU2 may be disposed on the third well region 3n. The second pull-down element PD2 may be a second NMOS transistor including a second NMOS gate electrode, a second NMOS drain region, and a second NMOS source region, while the second pull-up element PU2 may be a second PMOS transistor including a second PMOS gate electrode, a second PMOS drain region, and a PMOS source region.

The first and second pull-up elements PU1 and PU2 may be interposed between the first and second pull-down elements PD1 and PD2. The first pull-up element PU1 may be interposed between the second pull-up element PU2 and the second pull-down element PD2. The first pull-up element PU1 may be closer to the second pull-down element PD2 than to the first pull-down element PD1. The second pull-up element PU2 may be interposed between the first pull-up element PU1 and the first pull-down element PD1. The second pull-up element PU2 may be closer to the first pull-down element PD1 than to the second pull-down element PD2.

A first conductive pattern 15a may be disposed across the first and third active regions 9a and 9c. A second conductive pattern 15b may be disposed across the second and fourth active regions 9b and 9d. A portion of the first conductive pattern 15a, which may overlap the first active region 9a, may be defined as the first NMOS gate electrode of the first pull-down element PD1. A portion of the first conductive pattern 15a, which may overlap the third active region 9c, may be defined as the first PMOS gate electrode of the first pull-up element PU1. A portion of the second conductive pattern 15b, which may overlap the second active region 9b, may be defined as the second NMOS gate electrode of the second pull-down element PD2. A portion of the second conductive pattern 15b, which may overlap the fourth active region 9d, may be defined as the second PMOS gate electrode of the second pull-up element PU2.

A first shared contact pattern 30a may be disposed to be electrically connected to the second PMOS drain region of the second pull-up element PU2 and the first conductive pattern 15a. The first shared contact pattern 30a may overlap a portion of the first conductive pattern 15a, which may be interposed between the first and third active regions 9a and 9c, and also overlap the second PMOS drain region of the second pull-up element PU2. The first shared contact pattern 30a may be interposed between the first pull-down element PD1 and the first pull-up element PU1.

A second shared contact pattern 30b may be disposed to be electrically connected to the first PMOS drain region of the first pull-up element PU1 and the second conductive pattern 15b. The second shared contact pattern 30b may overlap a portion of the second conductive pattern 15b, which may be interposed between the second and fourth active regions 9b and 9d, and also overlap the first PMOS drain region of the first pull-up element PU1. The second shared contact pattern 30b may be interposed between the second pull-down element PD2 and the second pull-up element PU2.

First and second NMOS contact patterns 31a and 31b may be disposed on the first NMOS drain region of the first pull-down element PD1, and the second NMOS drain region of the second pull-down element PD2.

A first connection pattern 36a may be disposed to be electrically connected to the first shared contact pattern 30a and the NMOS contact pattern 31c disposed on the second NMOS drain region of the second pull-down element PD2. A second connection pattern 36b may be disposed to be electrically connected to the second shared contact pattern 30b and the first NMOS contact pattern 31a disposed on the first NMOS drain region of the first pull-down element PD1. The first and second inverters INT_1 and INT_2 may be cross-coupled to each other through the first and second connection patterns 36a and 36b and the first and second shared contact patterns 30a and 30b.

According to the example embodiment, the semiconductor device including the first and second inverters INT_1 and INT_2 may be provided.

Among the elements PD1, PU1, PD2, and PU2 constituting the first and second inverters INT_1 and INT_2, the second pull-up element PU2 may be disposed between the first pull-down element PD1 and the first pull-up element PU1, and the first pull-up element PU1 may be disposed between the second pull-down element PD2 and the second pull-up element PU2 so that interference between the first pull-down element PD1 and the first pull-up element PU1, and interference between the second pull-down element PD2 and the second pull-up element PU2 can be prevented or reduced.

Hereinafter, an example of the semiconductor device including the first and second inverters INT_1 and INT_2 will be described with reference to FIGS. 2 through 8F along with FIGS. 1A and 1B.

Figure 2:
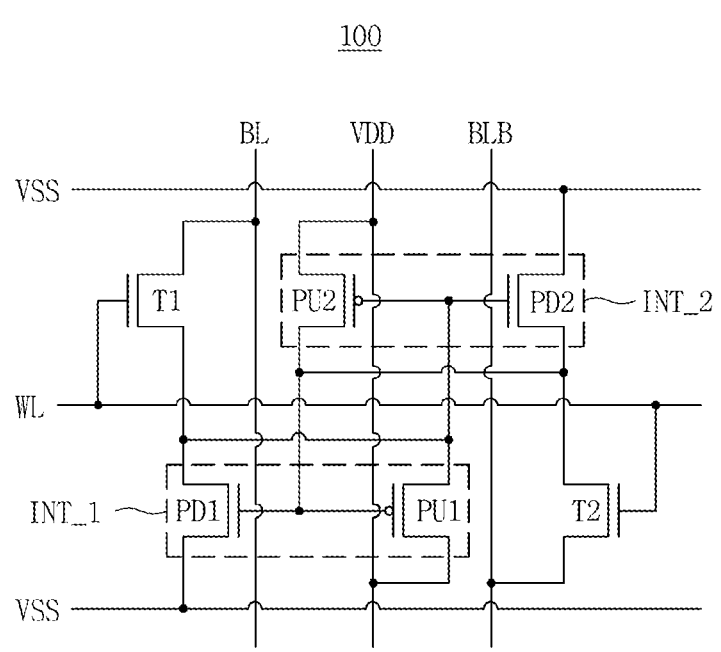
FIG. 2 is a circuit diagram of an example of a semiconductor device according to an example embodiment.

FIG. 2 is a circuit diagram of an example of the semiconductor device adopting the first and second inverters INT_1 and INT_2 shown in FIGS. 1A and 1B. FIGS. 3A through 8A are plan views of an example of the semiconductor device adopting the first and second inverters INT_1 and INT_2 shown in FIGS. 1A and 1B, and FIGS. 3B, 4B, 4C, 4D, 5B, 5C, 5D, 6B, 6C, 6D, 7B, 7C, 7D, 7E, 7F, 8B, 8C, 8D, 8E, and 8F are cross-sectional views corresponding to portions of the plan views of FIGS. 3A through 8A.

FIGS. 3A, 4A, 5A, 6A, 7A, and 8A are plan views illustrating process operations of a method of fabricating an example of the semiconductor device adopting the first and second inverters INT_1 and INT_2, according to an example embodiment.

In FIGS. 3B through 8B, portions denoted by lines I-I' are cross-sectional portions corresponding to regions taken along lines I-I' of FIGS. 3A through 8A, and portions denoted by lines II-II' are cross-sectional portions corresponding to regions taken along lines II-II' of FIGS. 3A through 8A.

In FIGS. 4C through 8C, portions denoted by lines III-III' are cross-sectional portions corresponding to regions taken along lines III-III' of FIGS. 5A through 8A, and portions denoted by lines IV-IV' are cross-sectional portions corresponding to regions taken along lines IV-IV' of FIGS. 5A through 8A.

In FIGS. 4D through 8D, portions denoted by lines V-V' are cross-sectional portions corresponding to regions taken along lines V-V' of FIGS. 5A through 8A, and portions denoted by lines VI-VI' are cross-sectional portions corresponding to regions taken along lines VI-VI' of FIGS. 5A through 8A.

Figure 7A:
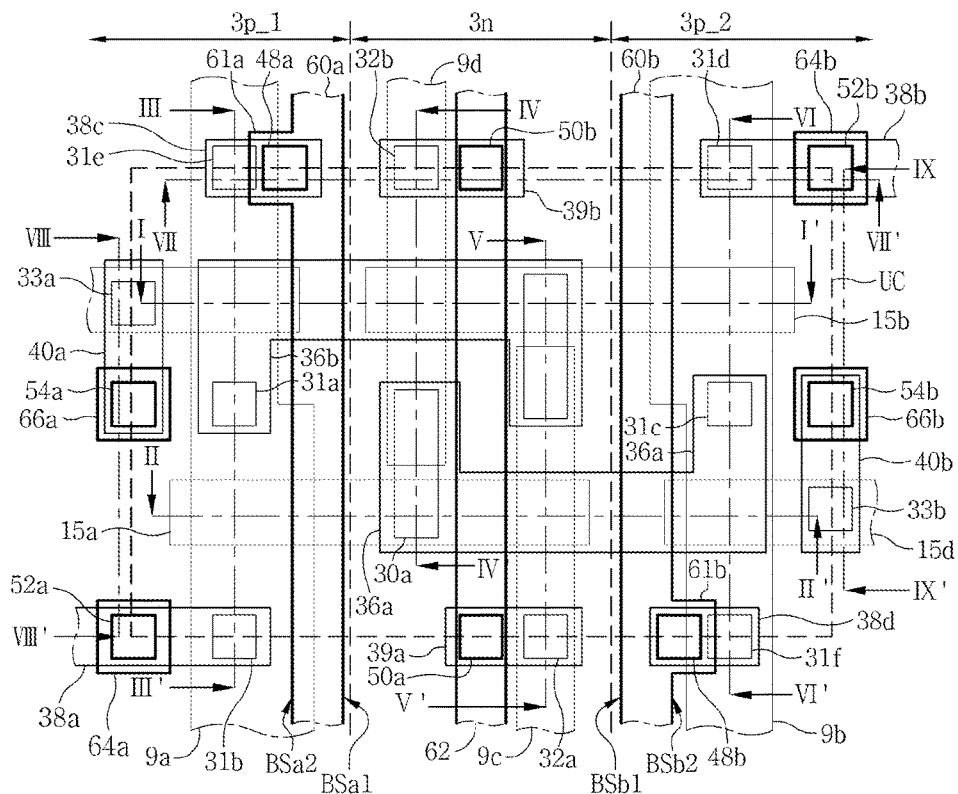
Figure 7B:
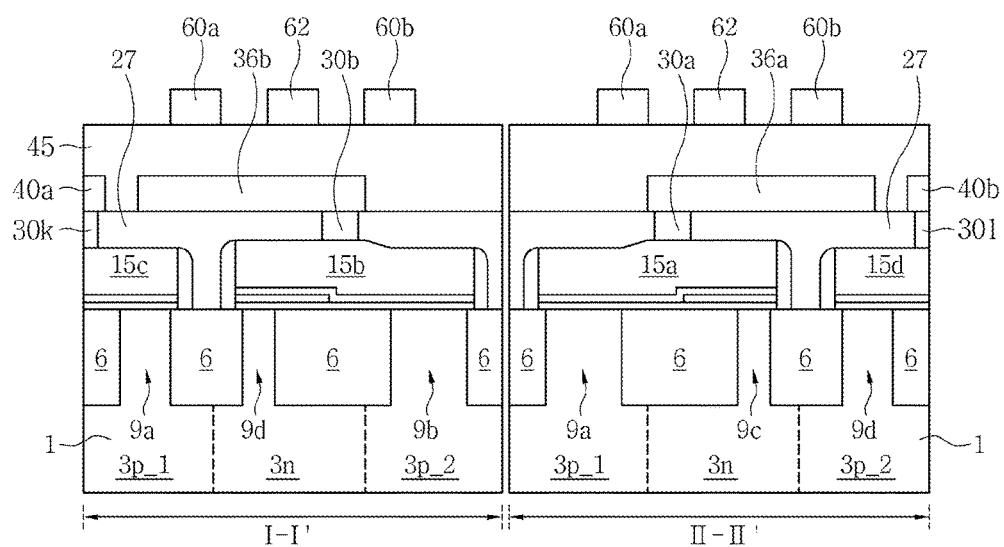
Figure 7C:
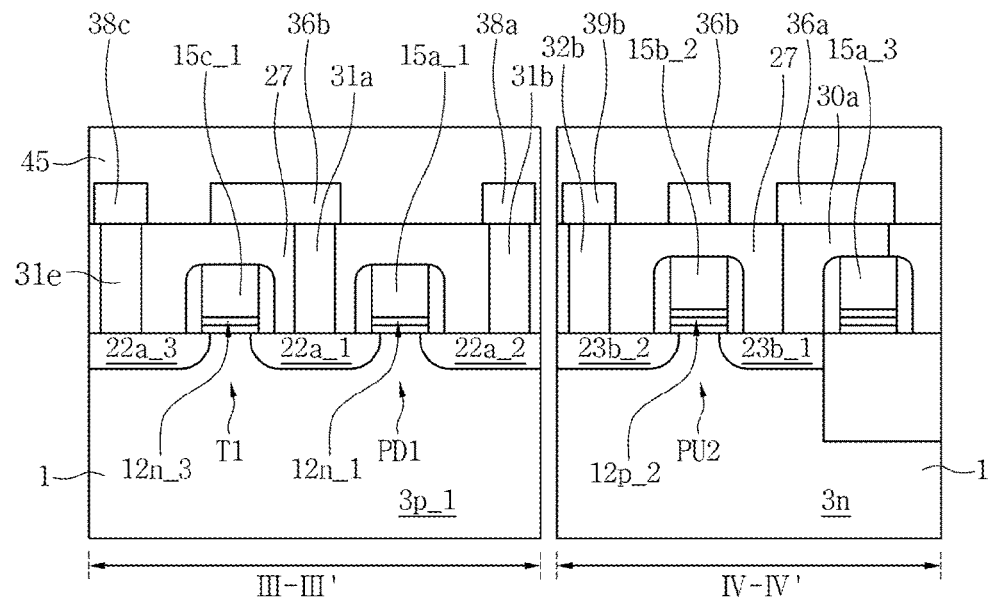
Figure 7D:
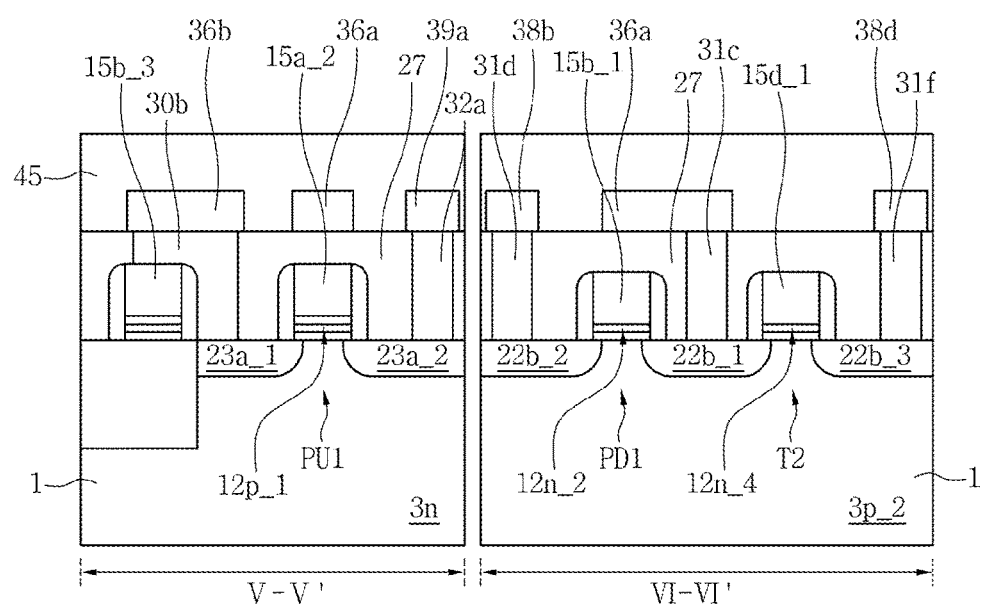
Figure 7E:
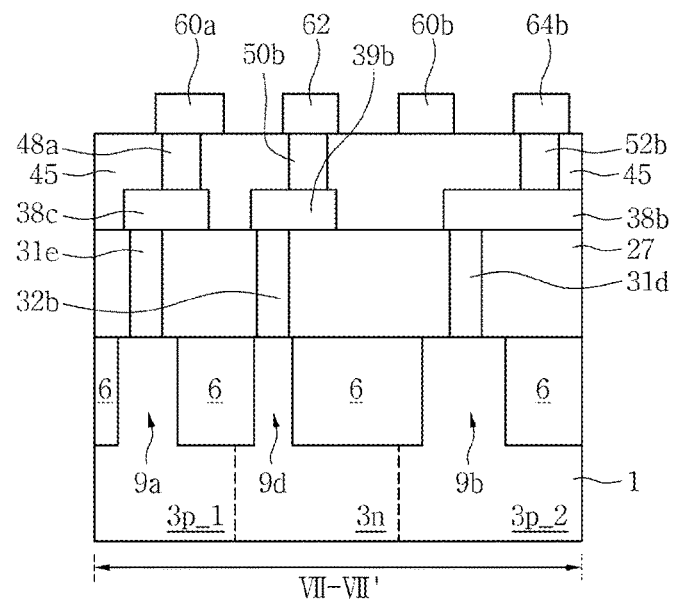
Figure 8A:
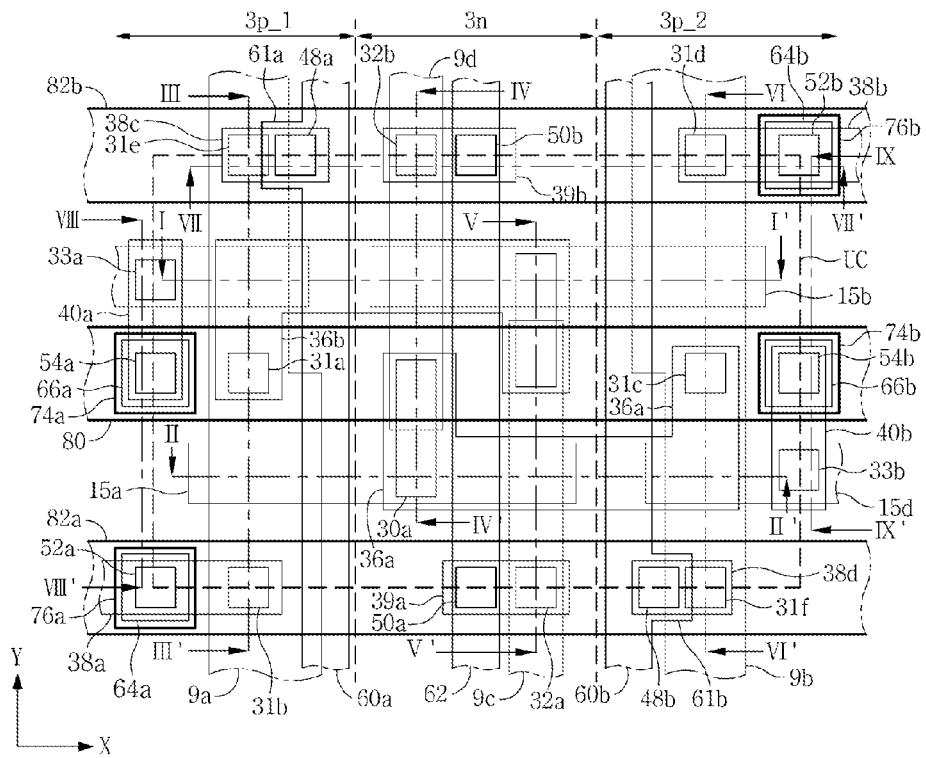
Figure 8B:
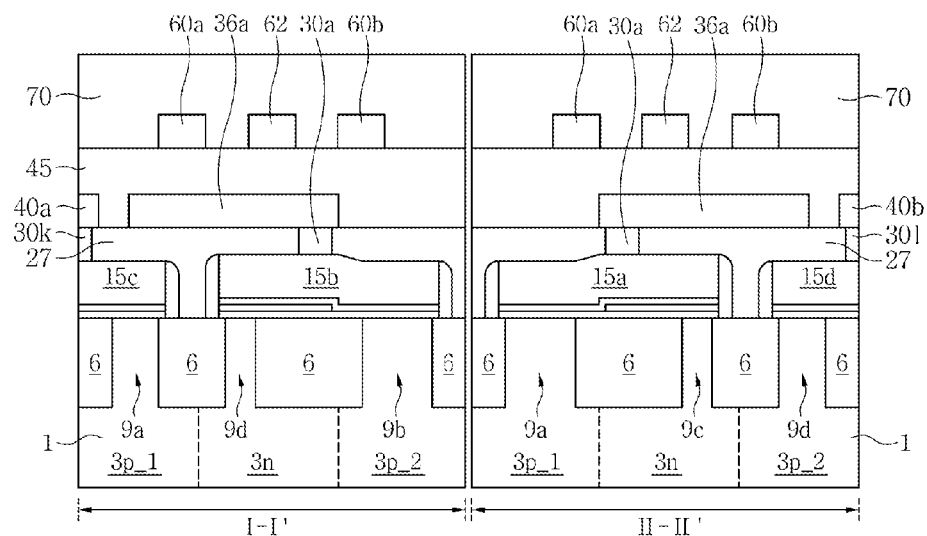
Figure 8C:
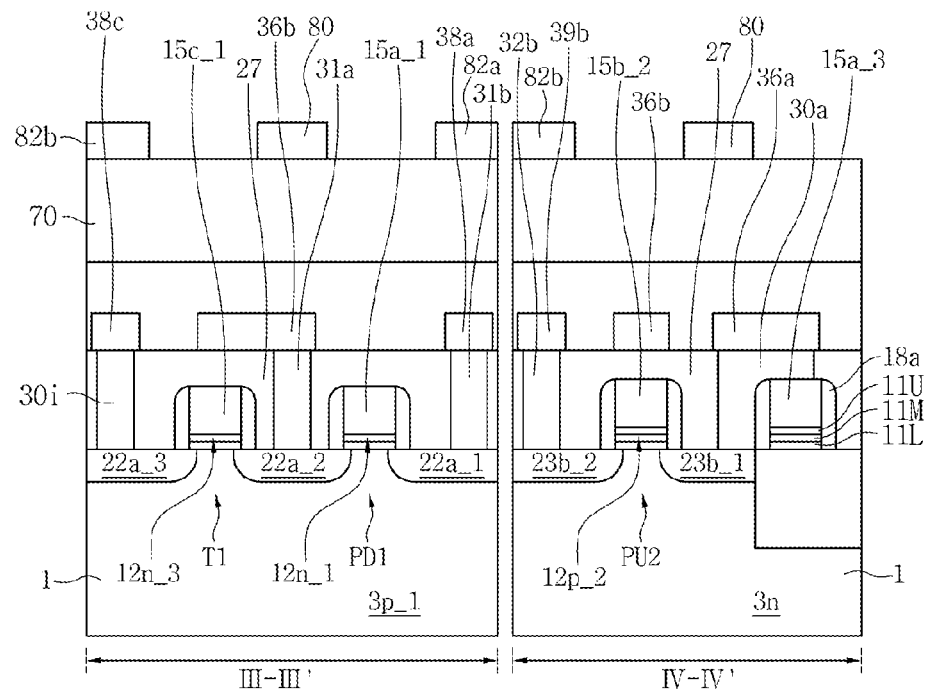
Figure 8D:
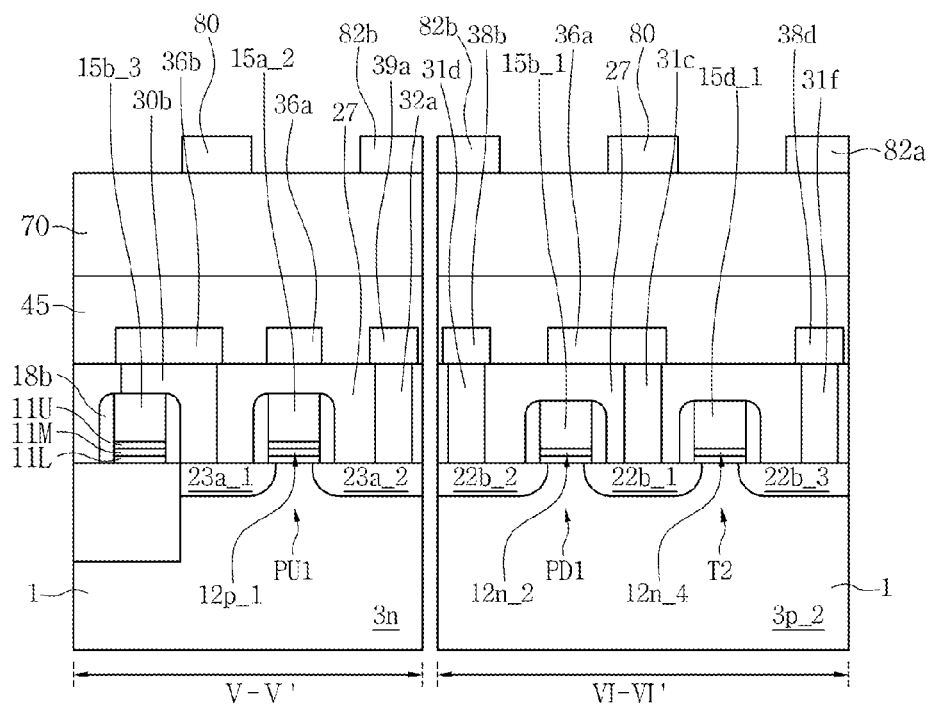
Figure 8E:
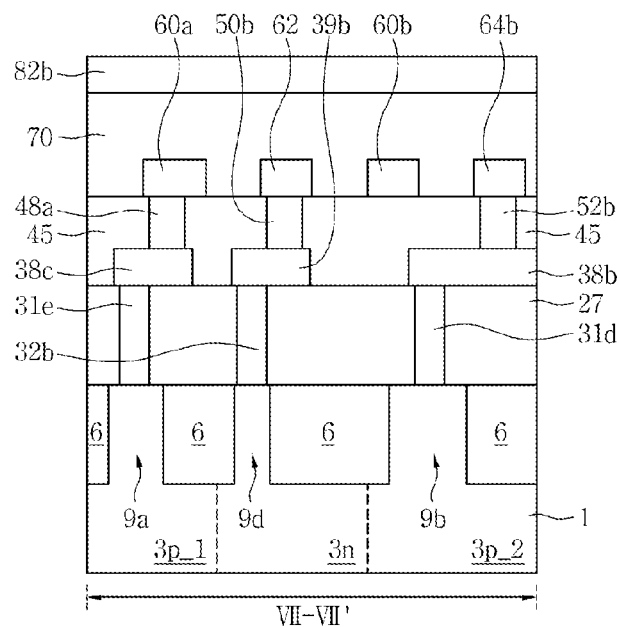

FIGS. 7E and 8E are cross-sectional views of regions taken along lines VII-VII' of FIGS. 7A and 8A.

Figure 7F:
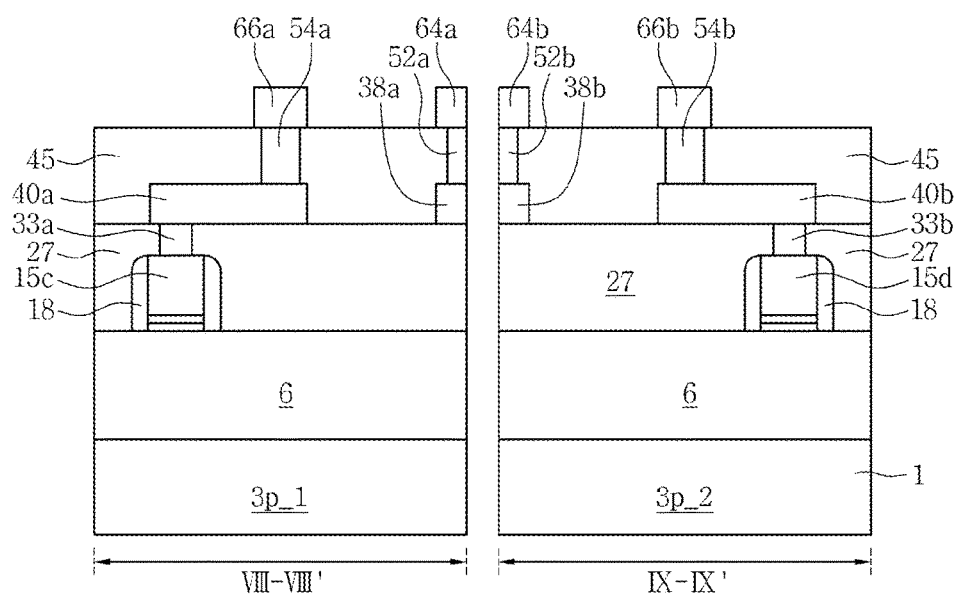
Figure 8F:
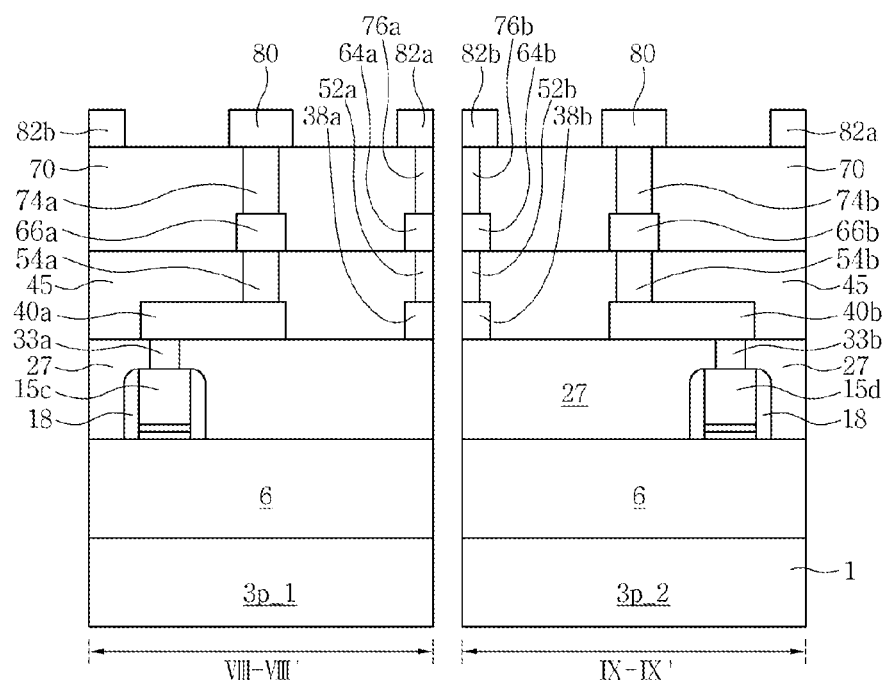

In FIGS. 7F and 8F, portions denoted by lines VIII-VIII' are cross-sectional portions corresponding to regions taken along lines VIII-VIII' of FIGS. 7A and 8A, and portions denoted by lines IX-IX' are cross-sectional portions corresponding to regions taken along lines IX-IX' of FIGS. 7A and 8A.

To begin with, an example of the semiconductor device including the first and second inverters INT_1 and INT_2 will now be described with the circuit diagram of FIG. 2 along with FIGS. 1A and 1B.

Referring to FIGS. 1A, 1B, and 2, a semiconductor device 100 including the first and second inverters INT_1 and INT_2 may be provided. The first and second inverters INT_1 and INT_2 may be cross-coupled to each other to form a storage element.

As described above with reference to FIGS. 1A and 1B, the first inverter INT_1 may include the first pull-down element PD1 and the first pull-up element PU1, while the second inverter INT_2 may include the second pull-down element PD2 and the second pull-up element PU2.

The semiconductor device 100 may include a 6-transistor static random access memory (6T-SRAM) including two access elements T1 and T2 electrically connected to the first and second inverters INT_1 and INT_2. The first access element T1 may be a third NMOS transistor. The second access element T2 may be a fourth NMOS transistor.

Example embodiments are not limited to the 6T-SRAM. For example, the semiconductor device according to an example embodiment may include a 7-transistor SRAM (7T-SRAM), an 8-transistor SRAM (8T-SRAM), a 9-transistor SRAM (9T-SRAM), or a 10-transistor SRAM (10T-SRAM). For instance, each of the 7T-SRAM, 8T-SRAM, 9T-SRAM, and 10T-SRAM may include the first and second inverters INT_1 and INT_2 described above with reference to FIGS. 1A and 1B.

An example of the semiconductor device including the first and second inverters INT_1 and INT_2 will be described with reference to the plan and cross-section illustrations of FIGS. 3F through 8F along with FIGS. 1A, 1B, and 2.

Figure 3A:
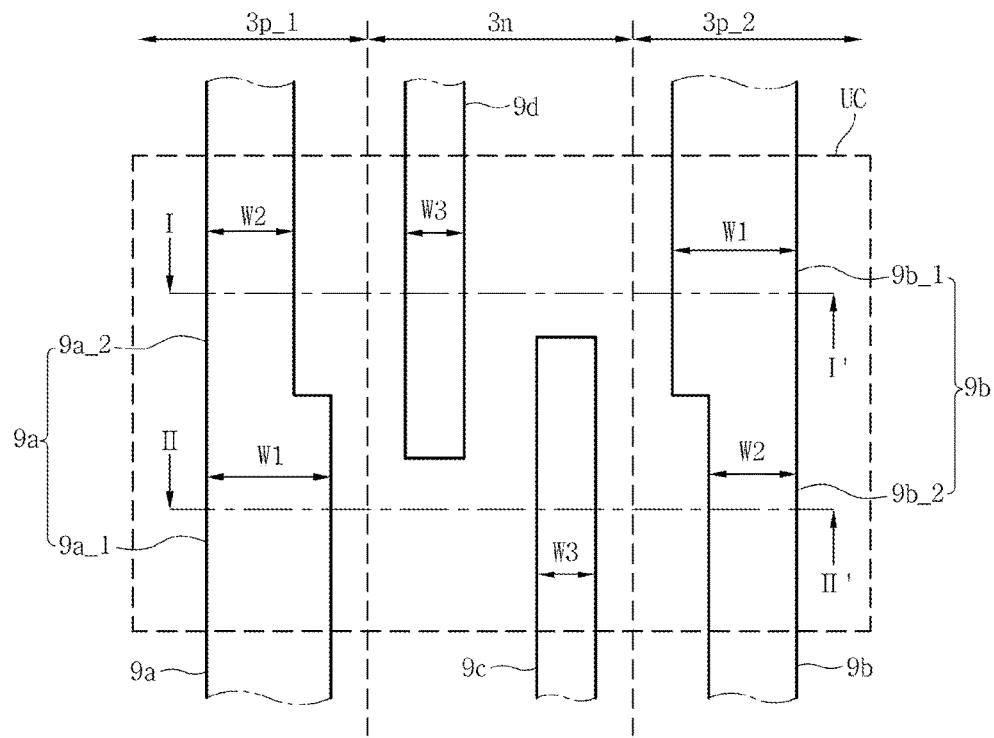
Figure 3B:
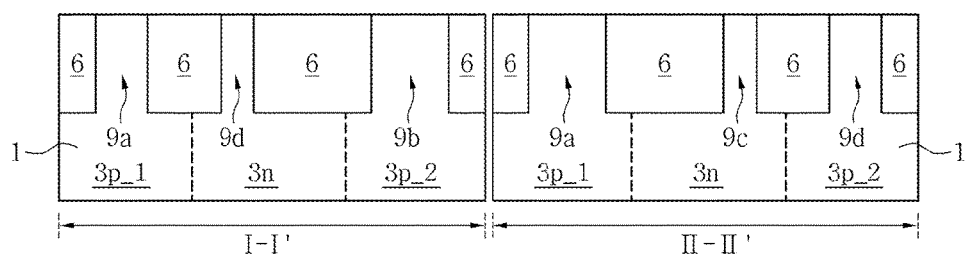
FIGS. 3B, 4B, 4C, 4D, 5B, 5C, 5D, 6B, 6C, 6D, 7B, 7C, 7D, 7E, 7F, 8B, 8C, 8D, 8E, and 8F are cross-sectional views corresponding to portions of the plan views of FIGS. 3A through 8A.
Figure 4A:
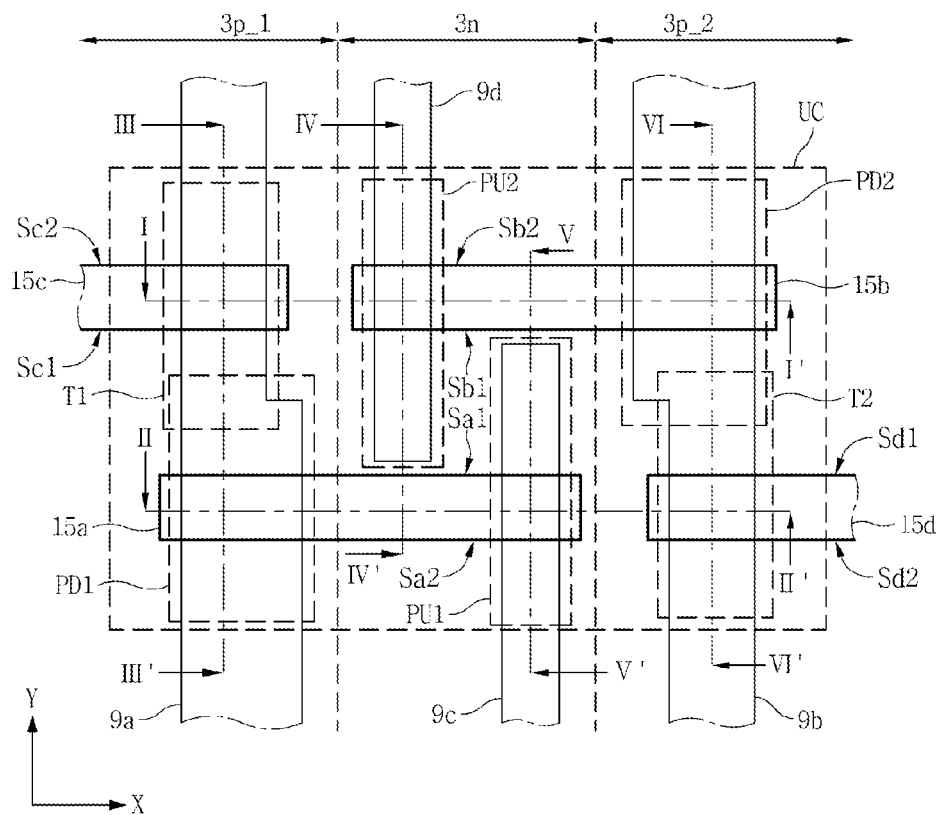
Figure 4B:
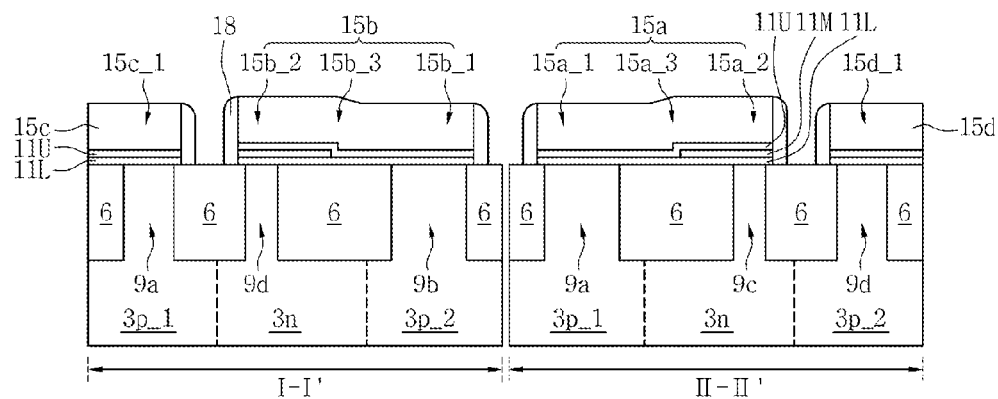
Figure 4C:
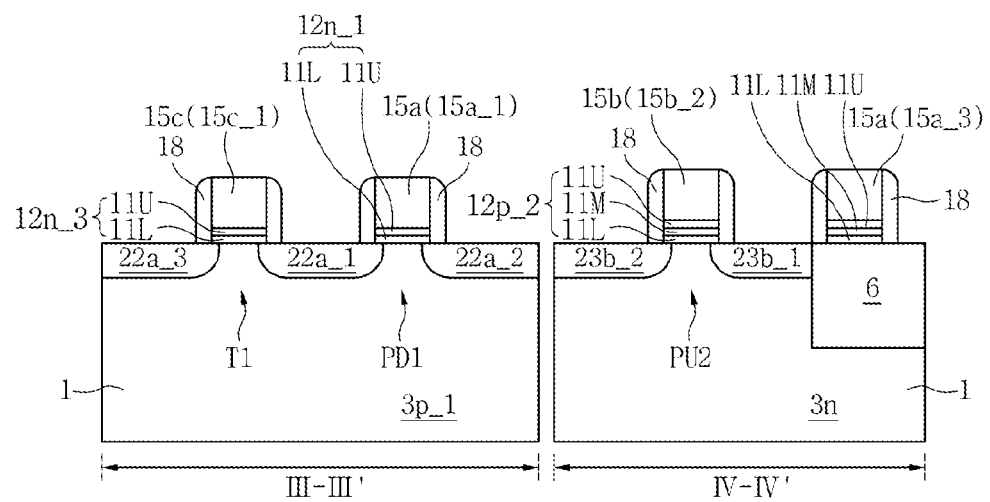
Figure 4D:
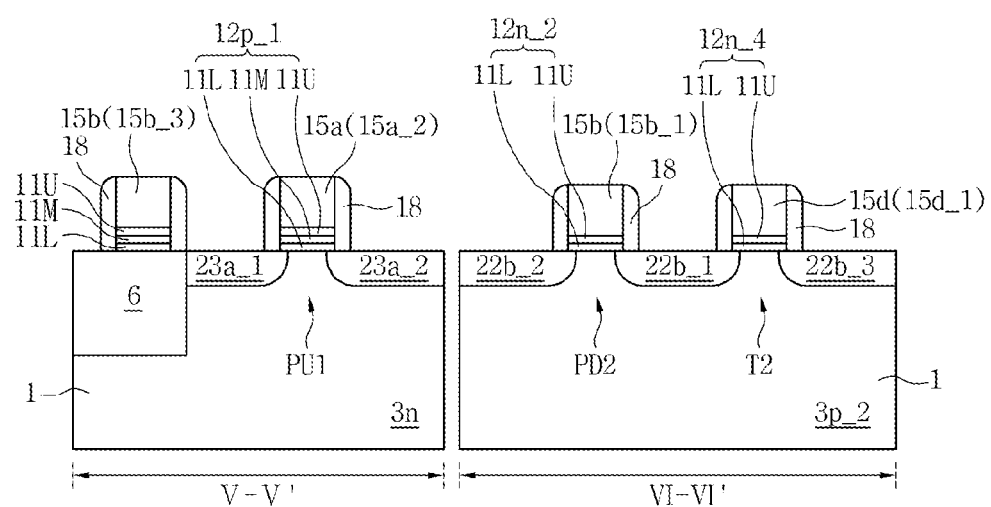
Figure 5A:
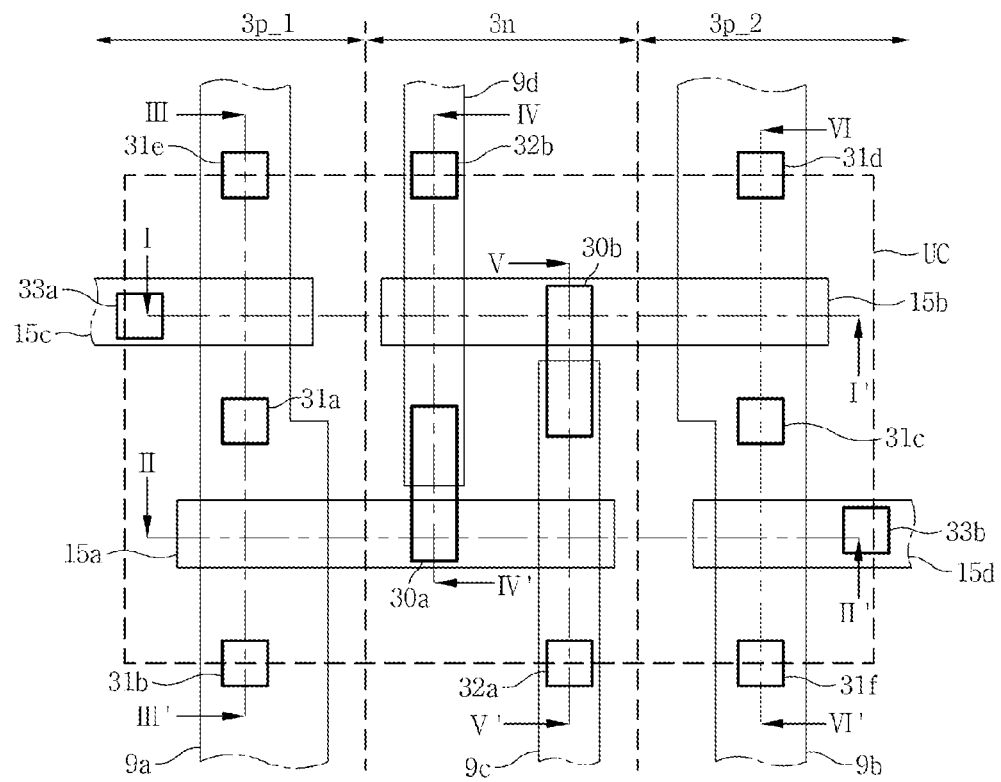
Figure 5B:
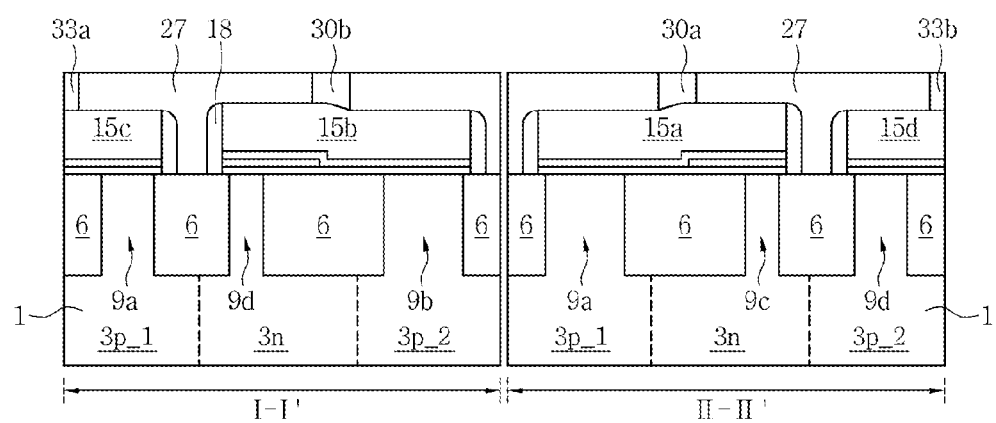
Figure 5C:
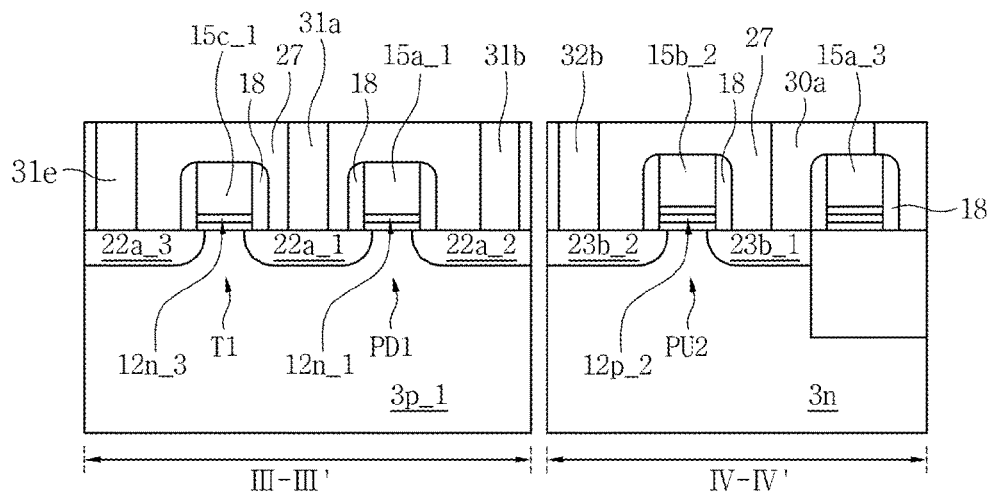
Figure 5D:
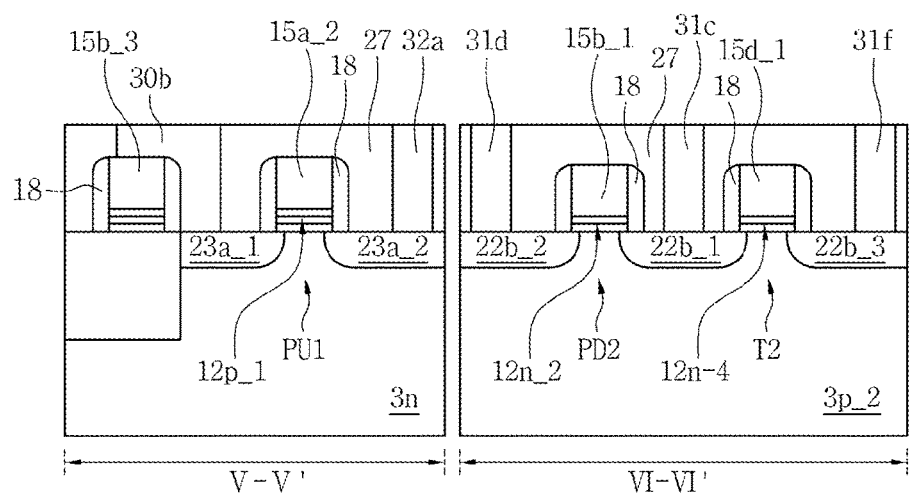
Figure 6A:
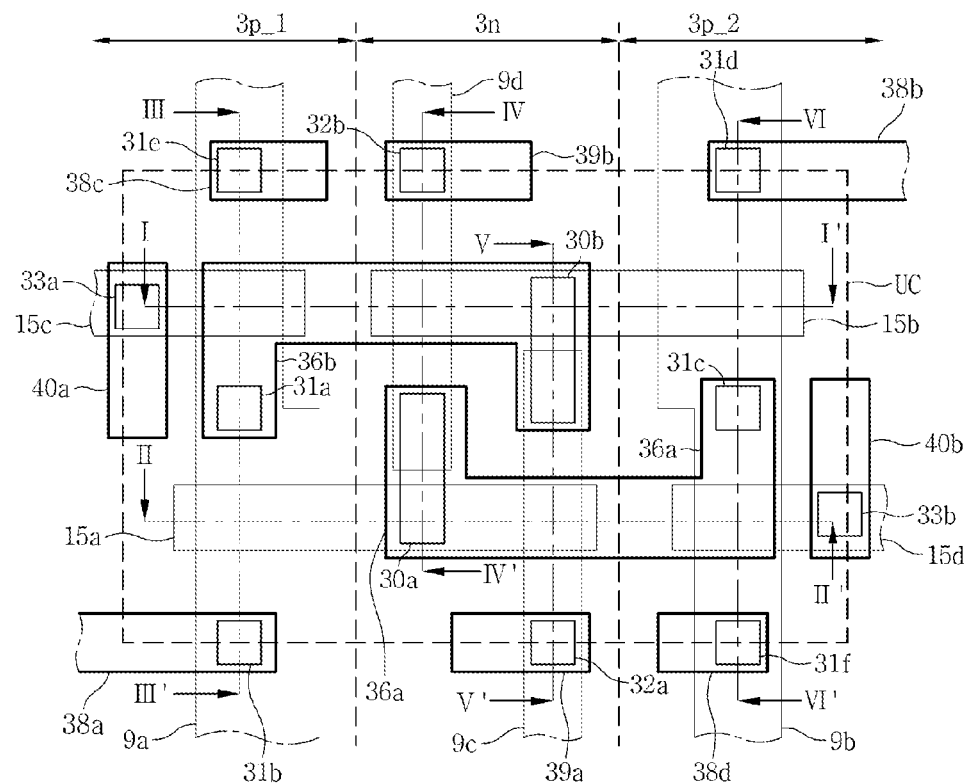
Figure 6B:
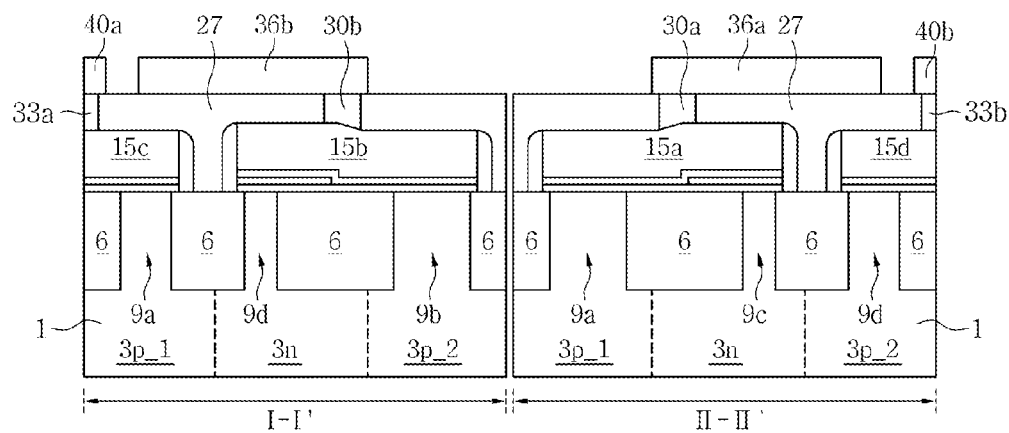
Figure 6C:
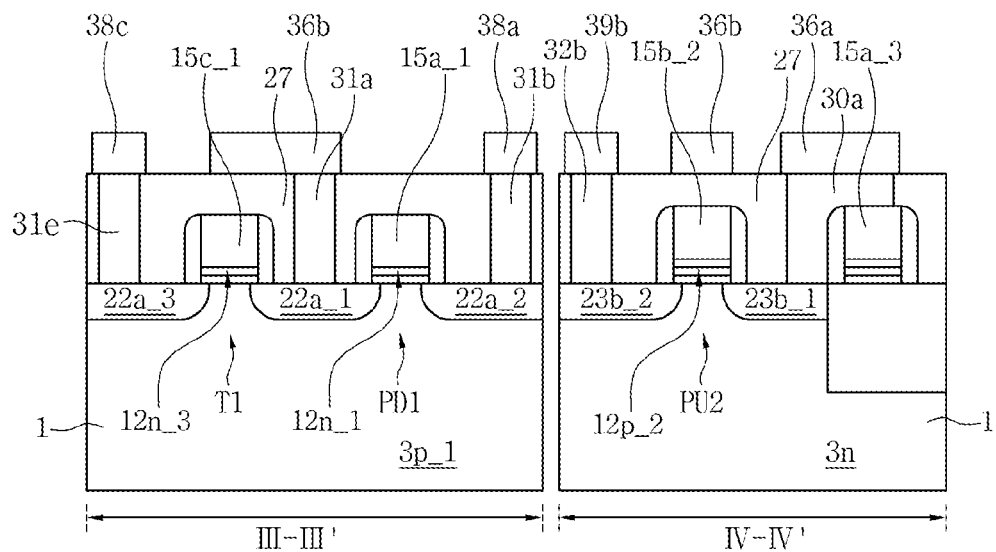
Figure 6D:
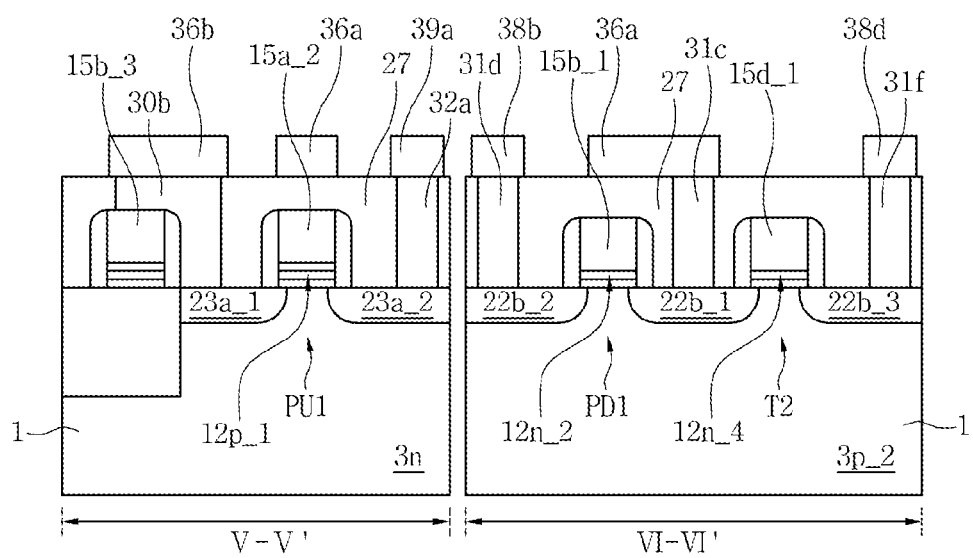

Referring to FIGS. 1A, 1B, 2, 3A, and 3B, a semiconductor substrate 1 may be provided. In FIG. 3A, reference character "UC" refers to a unit cell region. For example, reference character "UC" refers to a unit cell region of an SRAM device.

The semiconductor substrate 1 may include a plurality of well regions. The semiconductor substrate 1 may include a first well region 3p_1, a second well region 3p_2, and a third well region 3n interposed between the first and second well regions 3p_1 and 3p_2. The first and second well regions 3p_1 and 3p_2 may have a first conductivity type, while the third well region 3n may have a second conductivity type different from the first conductivity type. For example, the first and second well regions 3p_1 and 3p_2 may be p-type wells, while the third well region 3n may be an n-type well.

An isolation region 6 defining a plurality of active regions may be disposed in the semiconductor substrate 1. The isolation region 6 may be a shallow trench isolation (STI) region. The plurality of active regions may include first, second, third, and fourth active regions 9a, 9b, 9c, and 9d. The first active region 9a may be disposed in the first well region 3p_1, the second active region 9b may be disposed in the second well region 3p_2, and the third and fourth active regions 9c and 9d may be disposed in the third well region 3n. The first and second active regions 9a and 9b may have a different conductivity type from the third and fourth active regions 9c and 9d. The first and second active regions 9a and 9b may have a p conductivity type, and the third and fourth active regions 9c and 9d may have an n conductivity type. The first, second, third, and fourth active regions 9a, 9b, 9c, and 9d may have portions parallel to one another. The first and second active regions 9a and 9b may be spaced apart from each other. Each of the first and second active regions 9a and 9b may run across the unit cell region UC of the semiconductor substrate 1.

The first active region 9a may have a first portion 9a_1 having a first width W1, and a second portion 9a_2 having a second width W2 that is smaller than the first width W1. The second active region 9b may have a first portion 9b_1 having the first width W1, and a second portion 9b_2 having the second width W2. The first portion 9a_1 of the first active region 9a may face the second portion 9b_2 of the second active region 9b, while the second portion 9a_2 of the first active region 9a may face the first portion 9b_1 of the second active region 9b.

The third and fourth active regions 9c and 9d may be interposed between the first and second active regions 9a and 9b. Each of the third and fourth active regions 9c and 9d may have a third width W3 that is smaller than the second width W2.

The third active region 9c may be disposed closer to the second active region 9b than to the first active region 9a. One end portion of the third active region 9c may be disposed in the unit cell region UC. One end portion of the third active region 9c may be interposed between the second and fourth active regions 9b and 9d.

The fourth active region 9d may be disposed closer to the first active region 9a than to the second active region 9b. One end portion of the fourth active region 9d may be disposed in the unit cell region UC. One end portion of the fourth active region 9d may be interposed between the first and third active regions 9a and 9c.

Portions of the third and fourth active regions 9c and 9d, which may not face each other, may be larger than portions of the third and fourth active regions 9c and 9d, which may face each other. A portion of the third active region 9c, which faces the second portion 9b_2 of the second active region 9b, may be larger than a portion of the third active region 9c, which faces the first portion 9b_1 of the second active region 9b. A portion of the fourth active region 9d, which faces the second portion 9a_2 of the first active region 9a, may be larger than a portion of the fourth active region 9d, which faces the first portion 9a_1 of the first active region 9a.

Referring to FIGS. 1A, 1B, 2, 4A, 4B, 4C, and 4D, the first inverter INT_1, the second inverter INT_2, the first access element T1, and the second access element T2 may be disposed on the semiconductor substrate 1.

The first inverter INT_1 may include the first pull-down element PD1 and the first pull-up element PU1. The first pull-down element PD1 may be disposed on the first well region 3p_1, and the first pull-up element PU1 may be disposed on the third well region 3n.

The first pull-down element PD1 may be a first NMOS transistor including a first NMOS gate electrode 15a_1, a first NMOS gate dielectric material 12n_1, a first NMOS drain region 22a_1, and a first NMOS source region 22a_2. The first pull-up element PU1 may be a first PMOS transistor including a first PMOS gate electrode 15a_2, a first PMOS gate dielectric material 12p_1, a first PMOS drain region 23a_1, and a first PMOS source region 23a_2.

The second inverter INT_2 may include a second pull-down element PD2 and a second pull-up element PU2. The second pull-down element PD2 may be disposed on the second well region 3p_2, while the second pull-up element PU2 may be disposed on the third well region 3n.

The second pull-down element PD2 may be a second NMOS transistor including a second NMOS gate electrode 15b_1, a second NMOS gate dielectric material 12n_2, a second NMOS drain region 22b_1, and a second NMOS source region 22b_2. The second pull-up element PU2 may be a second PMOS transistor including a second PMOS gate electrode 15b_2, a second PMOS gate dielectric material 12p_2, a second PMOS drain region 23b_1, and a second PMOS source region 23b_2.

The first pull-down element PD1, the second pull-up element PU2, the first pull-up element PU1, and the second pull-down element PD2 may be arranged to be in a zigzag shape. The first and second pull-up elements PU1 and PU2 may be interposed between the first and second pull-down elements PD1 and PD2. The first pull-up element PU1 may be closer to the second pull-down element PD2 than to the first pull-down element PD1. The second pull-up element PU2 may be closer to the first pull-down element PD1 than to the second pull-down element PD2.

The first access element T1 may be disposed on the first well region 3p_1. The first access element T1 may be a third NMOS transistor including a third NMOS gate electrode 15c_1, a third NMOS gate dielectric material 12n_3, a third NMOS drain region 22a_3, and a third NMOS source region 22a_1.

The second access element T2 may be disposed on the second well region 3p_2. The second access element T2 may be a fourth NMOS transistor including a fourth NMOS gate electrode 15d_1, a fourth NMOS gate dielectric material 12n_4, a fourth NMOS drain region 22b_3, and a fourth NMOS source region 22b_1.

The first pull-down element PD1, the first pull-up element PU1, and the second access element T2 may be sequentially arranged along a first direction X. The first NMOS gate electrode 15a_1 of the first pull-down element PD1, the first PMOS gate electrode 15a_2 of the first pull-up element PU1, and the fourth NMOS gate electrode 15d_1 of the second access element T2 may be arranged in a row along the first direction X.

The first access element T1, the second pull-up element PU2, and the second pull-down element PD2 may be arranged in a row along the first direction X. The third NMOS gate electrode 15c_1 of the first access element T1, the second PMOS gate electrode 15b_2 of the second pull-up element PU2, and the second NMOS gate electrode 15b_1 of the second pull-down element PD2 may be arranged in a row along the first direction X.

The first pull-down element PD1 and the first access element T1 may be arranged in a row along a second direction Y. The second direction Y may intersect the first direction X. For example, the second direction Y may be orthogonal to the first direction X. The second access element T2 and the second pull-down element PD2 may be arranged in a row along the second direction Y.

The first pull-up element PU1 may be disposed closer to the second access element T2 than to the first pull-down element PD1. The second pull-up element PU2 may be disposed closer to the first access element T1 than to the second pull-down element PD2.

The first conductive pattern 15a may be disposed across the first portion 9a_1 of the first active region 9a and the third active region 9c. The first conductive pattern 15a may have a bar shape. A portion of the first conductive pattern 15a, which may overlap the first portion 9a_1 of the first active region 9a, may be defined as the first NMOS gate electrode 15a_1 of the first pull-down element PD1. A portion of the first conductive pattern 15a, which may overlap the third active region 9c, may be defined as the first PMOS gate electrode 15a_2 of the first pull-up element PU1. Also, a portion of the first conductive pattern 15a, which may be interposed between the first NMOS gate electrode 15a_1 and the first PMOS gate electrode 15a_2, may be defined as a first gate connection 15a_3. The first NMOS gate electrode 15a_1 of the first pull-down element PD1 and the first PMOS gate electrode 15a_2 of the first pull-up element PU1 may be electrically connected to each other by the first gate connection 15a_3.

The second conductive pattern 15b may be disposed across the first portion 9b_1 of the second active region 9b and the fourth active region 9d. The second conductive pattern 15b may have a bar shape. The second conductive pattern 15b may have a portion facing the first conductive pattern 15a. A portion of the second conductive pattern 15b, which may overlap the first portion 9b_1 of the second active region 9b, may be defined as the second NMOS gate electrode 15b_1 of the second pull-down element PD2. A portion of the second conductive pattern 15b, which may overlap the fourth active region 9d, may be defined as the second PMOS gate electrode 15b_2 of the second pull-up element PU2. A portion of the second conductive pattern 15b, which may be interposed between the second NMOS gate electrode 15b_1 and the second PMOS gate electrode 15b 2, may be defined as a second gate connection 15b_3. The second NMOS gate electrode 15b_1 of the second pull-down element PD2 and the second PMOS gate electrode 15b_2 of the second pull-up element PU2 may be electrically connected to each other by the second gate connection 15b_3.

A third conductive pattern 15c may be disposed across the second portion 9a_2 of the first active region 9a and spaced apart from the first conductive pattern 15a. A portion of the third conductive pattern 15c, which may overlap the second portion 9a_2 of the first active region 9a, may be defined as the third NMOS gate electrode 15c_1 of the first access element T1.

A fourth conductive pattern 15d may be disposed across the second portion 9b_2 of the second active region 9b and spaced apart from the second conductive pattern 15b. A portion of the fourth conductive pattern 15d, which may overlap the second active region 9b, may be defined as the fourth NMOS gate electrode 15d_1 of the second access element T2.

The second and third conductive patterns 15b and 15c may have end portions facing each other. The facing end portions of the second and third conductive patterns 15b and 15c may be interposed between the first and fourth active regions 9a and 9d. The first and fourth conductive patterns 15a and 15d may have end portions facing each other. The facing end portions of the first and fourth conductive patterns 15a and 15d may be interposed between the second and fourth active regions 9b and 9c.

The first through fourth conductive patterns 15a, 15b, 15c, and 15d may be formed of the same conductive material, for example, polysilicon (poly-Si), tungsten (W), or aluminum (Al).

The first conductive pattern 15a may have a first side surface Sa1 and a second side surface Sa2 disposed opposite each other. The second conductive pattern 15b may have a first side surface Sb1 and a second side surface Sb2 disposed opposite each other. The first side surface Sa1 of the first conductive pattern 15a and the first side surface Sb1 of the second conductive pattern 15b may be opposite and parallel to each other. The third conductive pattern 15c may have a first side surface Sc1 and a second side surface Sc2 disposed opposite each other. The first side surface Sc1 of the third conductive pattern 15c may be opposite and parallel to the first side surface Sa1 of the first conductive pattern 15a. The fourth conductive pattern 15d may have a first side surface Sd1 and a second side surface Sd2 disposed opposite each other. The first side surface Sd1 of the fourth conductive pattern 15d may be opposite and parallel to the first side surface Sb1 of the second conductive pattern 15b.

The first NMOS drain region $22a\_1$ of the first pull-down element PD1 may be a first NMOS impurity region formed in the first active region 9a disposed adjacent to the first side surface Sa1 of the first conductive pattern 15a. The first NMOS source region $22a\_2$ of the first pull-down element PD1 may be a second NMOS impurity region formed in the first active region 9a disposed adjacent to the second side surface Sa2 of the first conductive pattern 15a.

The first PMOS drain region $23a\_1$ of the first pull-up element PU1 may be a first PMOS impurity region formed in the third active region 9c disposed adjacent to the first side surface Sa1 of the first conductive pattern 15a. The first PMOS source region $23a\_2$ of the first pull-up element PU1 may be a second PMOS impurity region formed in the third active region 9c disposed adjacent to the second side surface Sa2 of the first conductive pattern 15a.

The second NMOS drain region $22b\_1$ of the second pull-down element PD2 may be a third NMOS impurity region formed in the second active region 9b disposed adjacent to the first side surface Sb1 of the second conductive pattern 15b. The second NMOS source region $22b\_2$ of the second pull-down element PD2 may be a fourth NMOS impurity region formed in the second active region 9b disposed adjacent to the second side surface Sb2 of the second conductive pattern 15b.

The second PMOS drain region $23b\_1$ of the second pull-up element PU2 may be a third PMOS impurity region formed in the fourth active region 9d disposed adjacent to the first side surface Sb1 of the second conductive pattern 15b. The second PMOS source region $23b\_1$ of the second pull-up element PU2 may be a fourth PMOS impurity region formed in the fourth active region 9d disposed adjacent to the second side surface Sb2 of the second conductive pattern 15b.

The third NMOS source region $21a\_1$ of the first access element T1 may be the first NMOS impurity region formed in the first active region 9a disposed adjacent to the first side surface Sc1 of the third conductive pattern 15c. The third NMOS drain region $21a\_3$ of the first access element T1 may be a fifth NMOS impurity region formed in the first active region 9a disposed adjacent to the second side surface Sc2 of the third conductive pattern 15c.

The first pull-down element PD1 and the first access element T1 may share the first NMOS impurity region $21a\_1$ therebetween. The first NMOS impurity region $21a\_1$ may be both the first NMOS drain region of the first pull-down element PD1 and the third NMOS source region of the first access element T1.

The fourth NMOS source region $21b\_1$ of the second access element T2 may be the third NMOS impurity region formed in the second active region 9b disposed adjacent to the first side surface Sd1 of the fourth conductive pattern 15d. The fourth NMOS drain region $21b\_3$ of the second access element T2 may be a sixth NMOS impurity region formed in the second active region 9b disposed adjacent to the second side surface Sd2 of the fourth conductive pattern 15d.

The second pull-down element PD2 and the second access element T2 may share the third NMOS impurity region $21b\_1$ therebetween. The third NMOS impurity region $21b\_1$ may be both the second NMOS drain region of the second pull-down element PD2 and the fourth NMOS source region of the second access element T2.

The first NMOS gate dielectric material $12n\_1$ of the first pull-down element PD1 may be interposed between the first NMOS gate electrode $15a\_1$ and the first active region 9a. The first PMOS gate dielectric material $12p\_1$ of the first pull-up element PU1 may be interposed between the first PMOS gate electrode $15a\_2$ and the third active region 9c. The second NMOS gate dielectric material $12n\_2$ of the second pull-down element PD2 may be interposed between the second NMOS gate electrode $15b\_1$ and the second active region 9b. The second PMOS gate dielectric material $12p\_2$ of the second pull-up element PU2 may be interposed between the second PMOS gate electrode $15b\_2$ and the fourth active region 9d. The third NMOS gate dielectric material $12n\_3$ of the first access element T1 may be interposed between the first active region 9a and the third NMOS gate electrode $15c\_1$. The fourth NMOS gate dielectric material $12n\_4$ of the second access element T2 may be interposed between the second active region 9b and the fourth NMOS gate electrode $15d\_1$.

The first and second PMOS gate electric materials $12p\_1$ and $12p\_2$ may be formed of an oxide to a greater thickness than the first, second, third, and fourth NMOS gate dielectric materials $12n\_1$, $12n\_2$, $12n\_3$, and $12n\_4$. Each of the first and second PMOS gate dielectric materials $12p\_1$ and $12p\_2$ may have a multilayered structure or a stack structure.

The first and second PMOS gate dielectric materials $12p\_1$ and $12p\_2$ and the first, second, third, and fourth NMOS gate dielectric materials $12n\_1$, $12n\_2$, $12n\_3$, and $12n\_4$ may include the same material layer.

As compared with the first, second, third, and fourth NMOS gate dielectric materials $12n\_1$, $12n\_2$, $12n\_3$, and $12n\_4$, the first and second PMOS gate dielectric materials $12p\_1$ and $12p\_2$ may further include a middle gate dielectric material 11M. For example, the first, second, third, and fourth NMOS gate dielectric materials $12n\_1$, $12n\_2$, $12n\_3$, and $12n\_4$ may include a first gate oxide including a lower gate dielectric material 11L and an upper gate dielectric material 11U stacked sequentially. Also, each of the first and second PMOS gate dielectric materials $12p\_1$ and $12p\_2$ may include a second gate oxide including the lower gate dielectric material 11L, the middle gate dielectric material 11M, and the upper gate dielectric material 11U stacked sequentially.

The upper gate dielectric material 11U disposed under the first conductive pattern 15a may include a continuous layer that may overlap the first and third active regions 9a and 9c. Also, the upper gate dielectric material 11U disposed under the second conductive pattern 15b may include a continuous layer that may overlap the second and fourth active regions 9b and 9d.

The middle gate dielectric material 11M disposed under the first conductive pattern 15a may overlap the third active region 9c and have one end portion interposed between the first and third active regions 9a and 9c. For instance, the one end portion of the middle gate dielectric material 11M disposed under the first conductive pattern 15a may be disposed midway between the first and third active regions 9a and 9c.

In addition, the middle gate dielectric material 11M disposed under the second conductive pattern 15b may overlap the fourth active region 9d and have one end portion interposed between the second and fourth active regions 9b and 9d. For instance, the one end portion of the middle gate dielectric material 11M disposed under the second conductive pattern 15b may be disposed midway between the second and fourth active regions 9b and 9d.

One or two of the lower gate dielectric material 11L, the middle gate dielectric material 11M, and the upper gate dielectric material 11U may include a first dielectric material, while the remaining one or ones thereof may include a second dielectric material having a higher dielectric constant than the first dielectric material. For example, any one or two of the lower gate dielectric material 11L, the middle gate dielectric material 11M, and the upper gate dielectric material 11U may include silicon oxide, while the remaining one or ones thereof may include a high-k dielectric material having a higher dielectric constant than silicon oxide. For example, the high-k dielectric material may be a metal oxide (e.g., aluminum oxide (AlO), zirconium oxide (ZrO), or hafnium oxide (HfO)), silicon oxynitride (SiON), or silicon nitride (SiN).

Insulating spacers 18 may be disposed on side surfaces of the first, second, third, and fourth conductive patterns 15a, 15b, 15c, and 15d. The insulating spacers 18 may be formed of an insulating material, such as silicon oxide or silicon nitride.

In example embodiments, since the first pull-down element PD1, the second pull-up element PU2, the first pull-up element PU1, and the second pull-down element PD2 are sequentially arranged in zigzag, even if the integration density of the device is increased, a distance between the first pull-down element PD1 and the first pull-up element PU1 and a distance between the second pull-down element PD2 and the second pull-up element PU2 may be ensured. Therefore, problems caused by reductions in the distance between the first pull-down element PD1 and the first pull-up element PU1 and the distance between the second pull-down element PD2 and the second pull-up element PU2, may be prevented or reduced. For example, since the gate dielectric material 12p_1 of the first pull-up element PU1 may be prevented or reduced from being affected by the first pull-down element PD1, deterioration of characteristics of the first pull-up element PU1 due to the first pull-down element PD1 may be prevented or reduced. Furthermore, a process margin for forming an end portion of the middle gate dielectric material 11M disposed between the first pull-up element PU1 and the first pull-down element PD1, may be ensured.

Referring to FIGS. 1A, 1B, 2, 5A, 5B, 5C, and 5D, a first interlayer insulating layer 27 may be disposed on the semiconductor substrate 1 having the first and second inverters INT_1, the first access element T1, and the second access element T2.

A first shared contact pattern 30a may be disposed through the first interlayer insulating layer 27 and electrically connected to the first conductive pattern 15a and the third PMOS impurity region 23b_1. The first shared contact pattern 30a may overlap the first gate connection 15a_3 of the first conductive pattern 15a and overlap the third PMOS impurity region 23b_1. The first shared contact pattern 30a may be disposed between the first pull-down element PD1 and the first pull-up element PU1. The first shared contact pattern 30a may be electrically connected to the first conductive pattern 15a so that the first shared contact pattern 30a can be electrically connected to the first NMOS gate electrode 15a_1 of the first pull-down element PD1 and the first PMOS gate electrode 15a_2 of the first pull-up element PU1. Furthermore, the first shared contact pattern 30a may be electrically connected to the third PMOS impurity region 23b_1, that is, the second PMOS drain region of the second pull-up element PU2.

A second shared contact pattern 30b may be disposed through the first interlayer insulating layer 27 and electrically connected to the second conductive pattern 15b and the first PMOS impurity region 23a_1. The second shared contact pattern 30b may overlap the second gate connection 15b_3 of the second conductive pattern 15b and also the first PMOS impurity region 23a_1. The second shared contact pattern 30b may be disposed between the second pull-up element PU2 and the second pull-down element PD2. The second shared contact pattern 30b may be electrically connected to the second conductive pattern 15b so that the second shared contact pattern 30b can be electrically connected to the second NMOS gate electrode 15b_1 of the second pull-down element PD2 and the second PMOS gate electrode 15b_2 of the second pull-up element PU2. Furthermore, the second shared contact pattern 30b may be electrically connected to the first PMOS impurity region 23a_1, that is, the first PMOS drain region of the first pull-up element PU1.

A first NMOS contact pattern 31a may be disposed through the first interlayer insulating layer 27 and electrically connected to the first NMOS impurity region 22a_1. Since the first NMOS impurity region 22a_1 is both the first NMOS drain region of the first pull-down element PD1 and the third NMOS source region of the first access element T1, the first NMOS contact pattern 31a may be electrically connected to both the first NMOS drain region of the first pull-down element PD1 and the third NMOS source region of the first access element T1.

A second NMOS contact pattern 31b may be disposed through the first interlayer insulating layer 27 and electrically connected to the second NMOS impurity region 22a_2, that is, the first NMOS source region of the first pull-down element PD1.

A third NMOS contact pattern 31c may be disposed through the first interlayer insulating layer 27 and electrically connected to the third NMOS impurity region 22b_1. Since the third NMOS impurity region 22b_1 is both the second NMOS drain region of the second pull-down element PD2 and the fourth NMOS source region of the second access element T2, the third NMOS contact pattern 31c may be electrically connected to both the second NMOS drain region of the second pull-down element PD2 and the fourth NMOS source region of the second access element T2.

A fourth NMOS contact pattern 31d may be disposed through the first interlayer insulating layer 27 and electrically connected to the fourth NMOS impurity region 22b_2, that is, the second NMOS source region of the second pull-down element PD2.

A fifth NMOS contact pattern 31e may be disposed through the first interlayer insulating layer 27 and electrically connected to the fifth NMOS impurity region 22a_3, that is, the third NMOS drain region of the first access element T1.

A sixth NMOS contact pattern 31f may be disposed through the first interlayer insulating layer 27 and electrically connected to the sixth NMOS impurity region 22b_3, that is, the fourth NMOS drain region of the second access element T2.

A first PMOS contact pattern 32a may be disposed through the first interlayer insulating layer 27 and electrically connected to the second PMOS impurity region 23a_2, that is, the first PMOS source region of the first pull-up element PU1.

A second PMOS contact pattern 32b may be disposed through the first interlayer insulating layer 27 and electrically connected to the fourth PMOS impurity region 23b_2, that is, the second PMOS source region of the second pull-up element PU2.

A first gate contact pattern 33a may be disposed through the first interlayer insulating layer 27 and electrically connected to the third NMOS gate electrode 15c_1.

A second gate contact pattern 33b may be disposed through the first interlayer insulating layer 27 and electrically connected to the fourth NMOS gate electrode 15d_1.

The first and second shared contact patterns 30a and 30b, the first through sixth NMOS contact patterns 31a, 31b, 31c, 31d, 31e, and 31f, the first and second PMOS contact patterns 32a and 32b, and the first and second gate contact patterns 33a and 33b, may be formed of the same conductive material, such as poly-Si, tungsten, copper, or aluminum.

Referring to FIGS. 1A, 1B, 2, 6A, 6B, 6C, and 6D, a first connection pattern 36a may be disposed on the first interlayer insulating layer 27 and electrically connected to the first shared contact pattern 30a and the third NMOS contact pattern 31c. The first connection pattern 36a may be electrically connected to the first NMOS gate electrode 15a_1 of the first pull-down element PD1, the first PMOS gate electrode 15a_2 of the first pull-up element PU1, and the third PMOS impurity region 23b_1, that is, the second PMOS drain region of the second pull-up element PU2, through the first shared contact pattern 30a. Also, the first connection pattern 36a may be electrically connected to the third NMOS impurity region 22b_1, that is, the second NMOS drain region of the second pull-down element PD2, and the fourth NMOS source region of the second access element T2, through the third NMOS contact pattern 31c. Accordingly, the first NMOS gate electrode 15a_1 of the first pull-down element PD1, the first PMOS gate electrode 15a_2 of the first pull-up element PU1, the second PMOS drain region 23b_1 of the second pull-up element PU2, the second NMOS drain region 22b_1 of the second pull-down element PD2, and the fourth NMOS source region 22b_1 of the second access element T2 may be electrically connected by the first connection pattern 36a.

A second connection pattern 36b may be disposed on the first interlayer insulating layer 27 and electrically connected to the first NMOS contact pattern 31a and the second shared contact pattern 30b. The second connection pattern 36b may be in direct contact with the second shared contact pattern 30b and the first NMOS contact pattern 31a. The second connection pattern 36b may be electrically connected to the second NMOS gate electrode 15b_1 of the second pull-down element PD2, the second PMOS gate electrode 15b_2 of the second pull-up element PU2, and the first PMOS impurity region 23a_1, that is, the first PMOS drain region of the first pull-up element PU1. Also, the second connection pattern 36b may be electrically connected to the first NMOS impurity region 22a 1, that is, the first NMOS drain region of the first pull-down element PD1 and the third NMOS source region of the first access element T1, through the first NMOS contact pattern 31a. Accordingly, the second NMOS gate electrode 15b_1 of the second pull-down element PD2, the second PMOS gate electrode 15b_2 of the second pull-up element PU2, the first PMOS drain region 23a_1 of the first pull-up element PU1, the first NMOS drain region 22a_1 of the first pull-down element PD1, and the third NMOS source region 22a_3 of the first access element T1 may be electrically connected by the second connection pattern 36b.

A first NMOS pad pattern 38a may be disposed on the first interlayer insulating layer 27 and electrically connected to the second NMOS contact pattern 31b. A second NMOS pad pattern 38b may be disposed on the first interlayer insulating layer 27 and electrically connected to the fourth NMOS contact pattern 31d. A third NMOS pad pattern 38c may be disposed on the first interlayer insulating layer 27 and electrically connected to the fifth NMOS contact pattern 31e. A fourth NMOS pad pattern 38d may be disposed on the first interlayer insulating layer 27 and electrically connected to the sixth NMOS contact pattern 31f.

A first PMOS pad pattern 39a may be disposed on the first interlayer insulating layer 27 and electrically connected to the first PMOS contact pattern 32a. A second PMOS pad pattern 39b may be disposed on the first interlayer insulating layer 27 and electrically connected to the second PMOS contact pattern 32b.

A first gate pad pattern 40a may be disposed on the first interlayer insulating layer 27 and electrically connected to the first gate contact pattern 33a. A second gate pad pattern 40b may be disposed on the first interlayer insulating layer 27 and electrically connected to the second gate contact pattern 33b.

The first and second connection patterns 36a and 36b, the first through fourth NMOS pad patterns 38a, 38b, 38c, and 38d, the first and second PMOS pad patterns 39a and 39b, and the first and second gate pad patterns 40a and 40b, may be formed of the same conductive material, such as poly-Si, tungsten, copper, or aluminum.

Referring to FIGS. 1A, 1B, 2, 7A, 7B, 7C, 7D, 7E, and 7F, a second interlayer insulating layer 45 may be disposed on the substrate 1 having the first and second connection patterns 36a and 36b, the first through fourth NMOS pad patterns 38a, 38b, 38c, and 38d, the first and second PMOS pad patterns 39a and 39b, and the first and second gate pad patterns 40a and 40b. The second interlayer insulating layer 45 may include an insulating material, such as silicon oxide.

A first via 48a may be disposed through the second interlayer insulating layer 45 and electrically connected to the third NMOS pad pattern 38c. A second via 48b may be disposed through the second interlayer insulating layer 45 and electrically connected to the fourth NMOS pad pattern 38d. A third via 50a may be disposed through the second interlayer insulating layer 45 and electrically connected to the first PMOS pad pattern 39a. A fourth via 50b may be disposed through the second interlayer insulating layer 45 and electrically connected to the second PMOS pad pattern 39b. A fifth via 52a may be disposed through the second interlayer insulating layer 45 and electrically connected to the first NMOS pad pattern 38a. A sixth via 52b may be disposed through the second interlayer insulating layer 45 and electrically connected to the second NMOS pad pattern 38b. A seventh via 54a may be disposed through the second interlayer insulating layer 45 and electrically connected to the first gate pad pattern 40a. An eighth via 54b may be disposed through the second interlayer insulating layer 45 and electrically connected to the second gate pad pattern 40b. The first through eighth vias 48a, 48b, 50a, 50b, 52a, 52b, 54a, and 54b may be formed of the same conductive material, such as poly-Si, tungsten, copper, or aluminum.

A first bit line 60a may be disposed on the second interlayer insulating layer 45 and electrically connected to the first via 48a. A second bit line 60b may be disposed on the second interlayer insulating layer 45 and electrically connected to the second via 48b. A power line 62 may be disposed on the second interlayer insulating layer 45 and interposed between the first and second bit lines 60a and

60b. The first and second bit lines 60a and 60b and the power line 62 may include portions parallel to one another.

The first bit line 60a may have a first side surface BSa1 facing the second bit line 60b, and a second side surface BSa2 disposed opposite the first side surface BSa1. From the plan view, the first bit line 60a may have a portion 61a protruding from the second side surface BSa2 of the first bit line 60a to cover the first via 48a.

The second bit line 60b may have a first side surface BSb1 facing the first bit line 60a, and a second side surface BSb2 disposed opposite the first side surface BSb1. From the plan view, the second bit line 60b may have a portion 61b protruding from the second side surface BSb2 of the second bit line 60b to cover the second via 48b. The power line 62 may be disposed on the second interlayer insulating layer 45 and electrically connected to the third and fourth vias 50a and 50b. The power line 62 may be interposed between the first and second bit lines 60a and 60b. From the plan view, the power line 62 may have a line shape and overlap the third and fourth vias 50a and 50b.

A first ground pad 64a may be disposed on the second interlayer insulating layer 45 and electrically connected to the fifth via 52a. A second ground pad 64b may be disposed on the second interlayer insulating layer 45 and electrically connected to the sixth via 52b. A first word line pad 66a may be disposed on the second interlayer insulating layer 45 and electrically connected to the seventh via 54a. A second word line pad 66b may be disposed on the second interlayer insulating layer 45 and electrically connected to the eighth via 54b.

The first and second bit lines 60a and 60b, the power line 62, the first and second ground pads 64a and 64b, and the first and second word line pads 66a and 66b, may be formed of the same conductive material, such as poly-Si, tungsten, copper, or aluminum.

Referring to FIGS. 1A, 1B, 2, 8A, 8B, 8C, 8D, 8E, and 8F, a third interlayer insulating layer 70 may be disposed on the substrate 1 having the first and second bit lines 60a and 60b, the power line 62, the first and second ground pads 64a and 64b, and the first and second word line pads 66a and 66b. A word line 80, a first ground line 82a, and a second ground line 82b may be disposed on the third interlayer insulating layer 70. The word line 80 may overlap the first and second word line pads 66a and 66b. A first word line via 74a may be disposed through the third interlayer insulating layer 70 and interposed between the word line 80 and the first word line pad 66a. The first word line via 74a may be electrically connected to the word line 80 and the first word line pad 66a. A second word line via 74b may be disposed through the third interlayer insulating layer 70 and interposed between the word line 80 and the second word line pad 66b. The second word line via 74b may be electrically connected to the word line 80 and the second word line pad 66b. The first ground line 82a may have a portion overlapping the first ground pad 64a. A first ground via 76a may be disposed through the third interlayer insulating layer 70 and interposed between the first ground line 82a and the ground pad 64a. The first ground via 76a may electrically connect the first ground line 82a and the ground pad 64a. The second ground line 82b may have a portion overlapping the second ground pad 64b. A second ground via 76b may be disposed through the third interlayer insulating layer 70 and interposed between the second ground line 82b and the ground pad 64a. The second ground via 64b may electrically connect the second ground line 82b and the ground pad 64a.

According to example embodiments, a semiconductor device includes a pair of inverters, in which a sufficient distance between a pull-up element and a pull-down element is ensured to prevent or reduce electrical interference between the pull-up element and the pull-down element.

Furthermore, according to example embodiments, since a layout capable of ensuring a sufficient distance between a pull-up element and a pull-down element constituting an inverter may be provided, dispersion characteristics of an SRAM including the inverter can be improved.

In addition, according to example embodiments, even if an integration density is increased, since a layout capable of ensuring a sufficient distance between a pull-up element and a pull-down element may be provided, a semiconductor device including an SRAM capable of increasing integration density and improving cell stability, may be provided.

Figure 9:
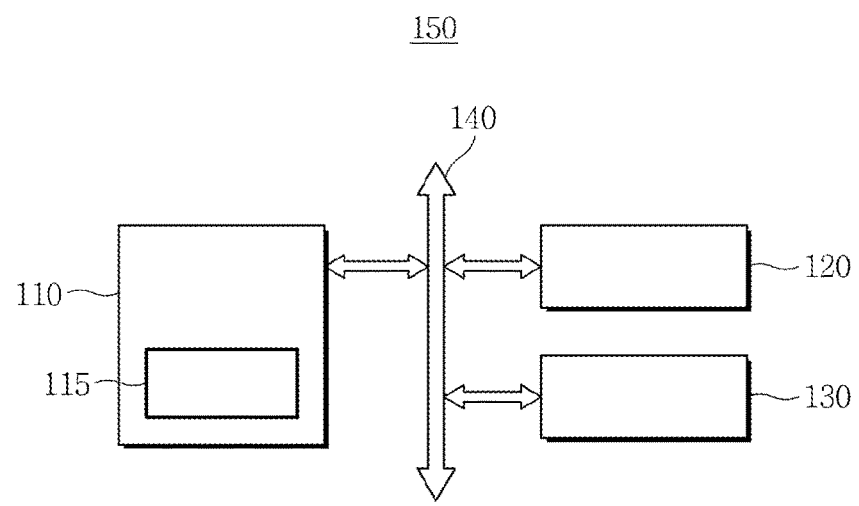
FIG. 9 is a block diagram of an electronic system including a semiconductor device according to an example embodiment.

FIG. 9 is a schematic block diagram of an electronic system including a semiconductor device according to example embodiments.

Referring to FIG. 9, an electronic system 150 including a processor 110, a memory unit 120, and an input/output (I/O) device 130, may be provided. The processor 110, the memory unit 120, and the I/O device 130 may communicate data with each other using a bus 140. The I/O device 130 may be used to input or output data of the electronic system 150. The electronic system 150 may be connected to an external apparatus, for example, a personal computer (PC) or a network, using the I/O device 150, and exchange data with the external apparatus. The memory unit 120 may store codes and data required for operations of the processor 110. The processor 110 may function to execute programs and control the electronic system 150. The processor 110 may include a memory device 115, such as a cache memory, a register, or a latch. The memory device 115 may include a semiconductor device according to example embodiments. For example, the memory device 115 may include the semiconductor device described with reference to FIGS. 1A and 1B, according to an example embodiment. The memory device 115 may include the semiconductor device (e.g., an SRAM) described with reference to FIGS. 2 through 8F, according to an example embodiment.

Figure 10:
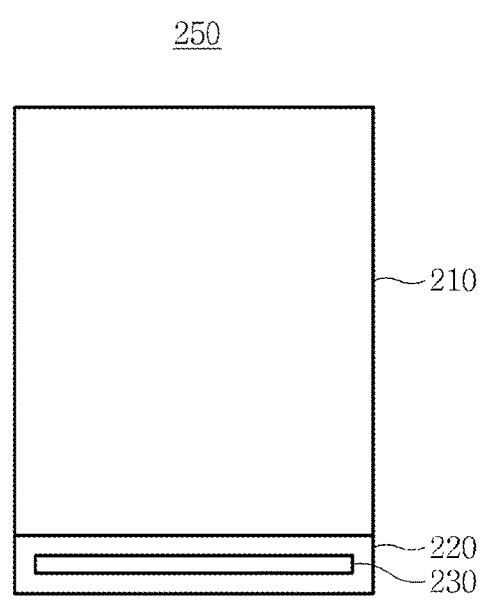
FIG. 10 is a schematic diagram of an electronic device including a semiconductor device according to example embodiments.

FIG. 10 is a schematic diagram of an example of an electronic device including a semiconductor device according to example embodiments. Referring to FIG. 10, an electronic device 200 including a display device 210 and a semiconductor component 220, may be provided. The semiconductor component 220 may be electrically connected to the display device 210. The semiconductor component 220 may be a module configured to drive the display device 210. The semiconductor component 220 may include a semiconductor device 230 according to example embodiments. For example, the semiconductor device 230 may be the semiconductor device described with reference to FIGS. 1A and 1B, according to an example embodiment. Alternatively, the semiconductor device 230 may be the semiconductor device (e.g., an SRAM) described with reference to FIGS. 2 through 8F, according to an example embodiment. For instance, the semiconductor device 230 may include the first and second inverters INT_1 and INT_2 described with reference to FIGS. 1A and 1B, or an SRAM cell described with reference to FIGS. 2 through 8F.

The semiconductor device 230 may be embodied by semiconductor packages having various shapes. For example, the semiconductor device 230 may be packaged using a Package on Package (PoP) technique, a ball grid array (BGA) technique, a chip-scale package (CSP) technique, a plastic-leaded chip carrier (PLCC) technique, a plastic dual in-line package (PDIP) technique, a die-in-waffle-pack technique, a die-in-wafer-form technique, a chip-on-board (COB) technique, a ceramic dual in-line package (CERDIP) technique, a plastic metric quad flat pack (MQFP) technique, a thin quad flatpack (TQFP) technique, a small outline (SOIC) technique, a shrink small outline package (SSOP) technique, a thin small outline (TSOP) technique, a thin quad flatpack (TQFP) technique, a system-in-package (SIP) technique, a multi-chip package (MCP) technique, a wafer-level fabricated package (WFP) technique, or a wafer-level processed stack package (WSP) technique.

The electronic device 200 may be applied to various electronic products using the display device 210, such as a mobile phone, a tablet PC, a portable computer, a personal portable information terminal, or household electronic products.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures.

What is claimed is:

1. A semiconductor device comprising:
 a first access element, a second pull-up element, and a second pull-down element sequentially arranged along a first direction on a semiconductor substrate;
 a first pull-down element, a first pull-up element, and a second access element sequentially arranged along the first direction on the semiconductor substrate; and
 wherein
  the first pull-down element and the first access element are sequentially arranged along a second direction intersecting the first direction,
  the second access element and the second pull-down element are sequentially arranged along the second direction,
  a first shared contact pattern between the first pull-down element and the first pull-up element,
  a second shared contact pattern between the second pull-down element and the second pull-up element,
  the first pull-down element and the first access element are in a first active region of the semiconductor substrate,
  the second pull-down element and the second access element are in a second active region of the semiconductor substrate,
  the first pull-up element is in a third active region of the semiconductor substrate,
  the second pull-up element is in a fourth active region of the semiconductor substrate,
  the third and fourth active regions are between the first and second active regions,
  the third active region is closer to the second active region than to the first active region,
  the fourth active region is closer to the first active region than to the second active region,
  each of the second and first active regions includes a first portion and a second portion, the first portion has a first width, and the second portion has a second width smaller than the first width,
  the first portion of the first active region faces inward towards the second portion of the second active region such that an inner sidewall of the first portion is closer to the fourth active region than an inner sidewall of the second portion of the first active region,
  the first portion of the second active region faces inward towards the second portion of the first active region such that an inner sidewall of the first portion is closer to the third active region than an inner sidewall of the second portion of the second active region,
  an outer sidewall of the first and second portions of the first active region is planar, and
  an outer sidewall of the first and second portions of the second active region is planar.

2. The device of claim 1, wherein
 the first pull-down element is a first NMOS transistor including a first NMOS gate electrode, a first NMOS source region, and a first NMOS drain region,
 the first pull-up element is a first PMOS transistor including a first PMOS gate electrode, a first PMOS source region, and a first PMOS drain region,
 the second pull-down element is a second NMOS transistor including a second NMOS gate electrode, a second NMOS source region, and a second NMOS drain region,
 the second pull-up element is a second PMOS transistor including a second PMOS gate electrode, a second PMOS source region, and a second PMOS drain region,
 the first access element is a third NMOS transistor including a third NMOS gate electrode, a third NMOS source region, and a third NMOS drain region, and
 the second access element is a fourth NMOS transistor including a fourth NMOS gate electrode, a fourth NMOS source region, and a fourth NMOS drain region.

3. The device of claim 2, wherein
 the first pull-down element and the first pull-up element form a first inverter,
 the second pull-down element and the second pull-up element form a second inverter,
 the first inverter includes the first NMOS gate electrode and the first PMOS gate electrode in a bar-shape, and
 the second inverter includes the second NMOS gate electrode and the second PMOS gate electrode in a bar-shape.

4. The device of claim 2, wherein
 the first shared contact pattern overlaps the second PMOS drain region, the first NMOS gate electrode and the first PMOS gate electrode; and
 the second shared contact pattern overlaps the first PMOS drain region, the second NMOS gate electrode and the second PMOS gate electrode.

5. The device of claim 1, wherein a first gate electrode of the first pull-down element and the first pull-up element crosses the first and third active regions, and a second gate electrode of the second pull-down element and the second pull-up element crosses the second and fourth active regions.

6. The device of claim 1, wherein
 the first shared contact pattern overlaps a point crossing an imaginary center line of a first gate electrode in the first direction and an imaginary center line of the fourth active region in the second direction, and
 the second shared contact pattern overlaps a point crossing an imaginary center line of a second gate electrode in the first direction and an imaginary center line of the third active region in the second direction.

7. The device of claim 1, wherein the first shared contact pattern overlaps the middle portion of a first unitary gate electrode of the first pull-down element and the first pull-up element, wherein the first unitary gate electrode is an unified single electrode of the first pull-down element and the first pull-up element,
  wherein the second shared contact pattern overlaps the middle portion of a second unitary gate electrode of the second pull-down element and the second pull-up element, and the second unitary gate electrode is an unified single electrode of the second pull-down element and the second pull-up element.

8. The device of claim 1, wherein the first pull-up element is closer to the second access element than to the first pull-down element in the first direction, the second pull-up element is closer to the first access element than to the second pull-down element in the first direction.

9. A semiconductor device comprising:
  a first access element, a second pull-up element, and a second pull-down element sequentially arranged along a first direction on a semiconductor substrate;
  a first pull-down element, a first pull-up element, and a second access element sequentially arranged along the first direction on the semiconductor substrate; and
  a first shared contact pattern between the first pull-down element and the first pull-up element,
  wherein
    the first pull-down element and the first access element are sequentially arranged along a second direction intersecting the first direction,
    the second access element and the second pull-down element are sequentially arranged along the second direction,
    the first pull-down element and the first access element are in a first active region of the semiconductor substrate,
    the second pull-down element and the second access element are in a second active region of the semiconductor substrate,
    the first pull-up element is in a third active region of the semiconductor substrate,
    the second pull-up element is in a fourth active region of the semiconductor substrate,
    the third and fourth active regions are between the first and second active regions,
    the third active region is closer to the second active region than to the first active region,
    the fourth active region is closer to the first active region than to the second active region,
    each of the second and first active regions includes a first portion and a second portion, the first portion has a first width, and the second portion has a second width smaller than the first width,
    the first portion of the first active region faces inward towards the second portion of the second active region such that an inner sidewall of the first portion is closer to the fourth active region than an inner sidewall of the second portion of the first active region,
    the first portion of the second active region faces inward towards the second portion of the first active region such that an inner sidewall of the first portion is closer to the third active region than an inner sidewall of the second portion of the second active region,
    an outer sidewall of the first and second portions of the first active region is planar, and
    an outer sidewall of the first and second portions of the second active region is planar.

10. The device of claim 9, further comprising:
  a second shared contact pattern between the second pull-down element and the second pull-up element, the second shared contact pattern overlapping the middle portion of a second unitary gate electrode of the second pull-down element and the second pull-up element,
  wherein the second unitary gate electrode is an unified single electrode of the second pull-down element and the second pull-up element.

11. The device of claim 9, wherein
  the first pull-down element is a first NMOS transistor including a first NMOS gate electrode, a first NMOS source region, and a first NMOS drain region,
  the first pull-up element is a first PMOS transistor including a first PMOS gate electrode, a first PMOS source region, and a first PMOS drain region,
  the second pull-down element is a second NMOS transistor including a second NMOS gate electrode, a second NMOS source region, and a second NMOS drain region,
  the second pull-up element is a second PMOS transistor including a second PMOS gate electrode, a second PMOS source region, and a second PMOS drain region,
  the first access element is a third NMOS transistor including a third NMOS gate electrode, a third NMOS source region, and a third NMOS drain region, and
  the second access element is a fourth NMOS transistor including a fourth NMOS gate electrode, a fourth NMOS source region, and a fourth NMOS drain region.

12. The device of claim 9, wherein
  the first shared contact pattern overlaps a point crossing an imaginary center line of a first gate electrode in the first direction and an imaginary center line of the fourth active region in the second direction.

13. The device of claim 9, wherein the first shared contact pattern
overlaps the middle portion of a first unitary gate electrode of the first pull-down element and the first pull-up element,
  wherein the first unitary gate electrode is an unified single electrode of the first pull-down element and the first pull-up element.

14. A semiconductor device comprising:
  a first access element, a second pull-up element, and a second pull-down element sequentially arranged along a first direction on a semiconductor substrate;
  a first pull-down element, a first pull-up element, and a second access element sequentially arranged along the first direction on the semiconductor substrate; and
  a first shared contact pattern between the first pull-down element and the first pull-up element,
  wherein
    the first pull-down element and the first access element are sequentially arranged along a second direction intersecting the first direction,
    the second access element and the second pull-down element are sequentially arranged along the second direction,
    the first pull-up element is closer to the second access element than to the first pull-down element in the first direction,
    the first pull-down element and the first access element are in a first active region of the semiconductor substrate, the second pull-down element and the second access element are in a second active region of the semiconductor substrate, the first pull-up element is in a third active region of the semiconductor substrate, the second pull-up element is in a fourth active region of the semiconductor substrate, the third and fourth active regions are between the first and second active regions, the third active region is closer to the second active region than to the first active region, the fourth active region is closer to the first active region than to the second active region, each of the second and first active regions includes a first portion and a second portion, the first portion has a first width, and the second portion has a second width smaller than the first width, the first portion of the first active region faces inward towards the second portion of the second active region such that an inner sidewall of the first portion is closer to the fourth active region than an inner sidewall of the second portion of the first active region, the first portion of the second active region faces inward towards the second portion of the first active region such that an inner sidewall of the first portion is closer to the third active region than an inner sidewall of the second portion of the second active region, an outer sidewall of the first and second portions of the first active region is planar, and an outer sidewall of the first and second portions of the second active region is planar.

15. The device of claim 14, wherein the second pull-up element is closer to the first access element than to the second pull-down element in the first direction.

16. The device of claim 14, further comprising:
a second shared contact pattern between the second pull-down element and the second pull-up element, the second shared contact pattern overlapping the middle portion of a second unitary gate electrode of the second pull-down element and the second pull-up element,
wherein the second unitary gate electrode is an unified single electrode of the second pull-down element and the second pull-up element.

17. The device of claim 14, wherein
the first shared contact pattern overlaps a point crossing an imaginary center line of a first gate electrode in the first direction and an imaginary center line of the fourth active region in the second direction.

* * * * *